(12) United States Patent
Arad et al.

(10) Patent No.: US 6,865,711 B2
(45) Date of Patent: Mar. 8, 2005

(54) SYSTEM OF AND METHOD FOR DECODING TRELLIS CODES

(75) Inventors: Eran Arad, Misgav (IL); Efraim Dalumi, Misgav (IL); Shachar Kons, Haifa (IL); Donald B. Eidson, San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 611 days.

(21) Appl. No.: 10/013,492

(22) Filed: Dec. 13, 2001

(65) Prior Publication Data

US 2002/0095640 A1 Jul. 18, 2002

Related U.S. Application Data

(60) Provisional application No. 60/386,182, filed on Nov. 13, 2001, provisional application No. 60/327,258, filed on Oct. 4, 2001, and provisional application No. 60/255,797, filed on Dec. 15, 2000.

(51) Int. Cl.$^7$ ............................................. H03M 13/00
(52) U.S. Cl. ..................................................... 714/796
(58) Field of Search ........................ 714/786, 791–796; 375/341, 262, 265

(56) References Cited

U.S. PATENT DOCUMENTS

| | | | | |
|---|---|---|---|---|
| 5,181,209 | A | | 1/1993 | Hagenauer et al. ......... 714/795 |
| 5,541,955 | A | | 7/1996 | Jacobsmeyer ............... 375/222 |
| 5,844,946 | A | * | 12/1998 | Nagayasu .................... 375/341 |
| 5,933,462 | A | | 8/1999 | Viterbi et al. ............... 375/341 |
| 6,023,783 | A | | 2/2000 | Divsalar et al. ............. 714/792 |
| 6,408,420 | B1 | * | 6/2002 | Todoroki .................... 714/795 |
| 6,510,536 | B1 | * | 1/2003 | Crozier et al. .............. 714/755 |
| 6,563,877 | B1 | * | 5/2003 | Abbaszadeh ................ 375/242 |
| 6,597,743 | B1 | * | 7/2003 | Khayrallah et al. ......... 375/265 |

OTHER PUBLICATIONS

Park et al., A block–wise MAP decoder using prbability ratio for branch metric, 1999, IEEE, p. 1610–1614.*
Boutillon et al., VLSI Architecture for the MAP algorithm, 1–2000, IEEE, p. 1–11.*
Robertson et al., A comparison of optimal and suboptimal MAP decoding algorithms operating in the Log domain, 1995, IEEE, p. 1009–1013.*
Bahl, L. R., et al., *Optimal Decoding of Linear Codes for Minimizing Symbol Error Rate*; IEEE Transactions on Information Theory, Mar. 1974, pp. 284–287.
Benedetto, S. and Montorsi, G., *Serial concatenation of block and convolutional codes*, Electronics Letters, vol. 32, No. 10, May 1996, pp. 887–888.
Benedetto, S. and Montorsi, G., *Iterative decoding of serially concatenated convolutional codes*; Electronics Letters, vol. 32, No. 13, Jun. 1996, pp. 1186–1188.
Benedetto, S., et al., *A Soft–Input Soft–Output Maximum A Posteriori (MAP)Module to Decode Parallel and Serial Concatenated Codes*; TDA Progress Report 42–127, Nov. 1996, pp. 1–20.

(List continued on next page.)

*Primary Examiner*—Shelly A Chase
(74) *Attorney, Agent, or Firm*—Howrey Simon Arnold & White LLP

(57) ABSTRACT

Systems and related methods are described for (1) determining one or more state probabilities for one or more states in a trellis representation; (2) determining an estimate of or extrinsic output for one or more bits using a trellis representation; (3) determining a branch metric for a branch in a trellis representation; (4) performing a MAX*2->1 operation; (5) performing a MAX*$2^P$->1 operation, where p is an integer of two or more, through a hierarchical arrangement of MAX*2->1 operations; and (6) computing forward state probabilities in a forward mode of operation and computing backward state probabilities in a backward mode of operation. Combinations of the foregoing are also described.

66 Claims, 25 Drawing Sheets

OTHER PUBLICATIONS

Benedetto, S. et al., *Serial Concatenated Trellis Coded Modulation with Iterative Decoding: Design and Performance*, submitted to IEEE Comm. Theory Mini Conference 97 (Globecom 97), pp. 38–43.

Benedetto, S., and Divsalar, D., *Turbo Codes: Analysis, Design, Iterative Decoding and Applications*, Course 909, Part II, International Courses for Telecom and Semiconductor Professionals, Oct. 25–29, 1999, Barcelona, Spain, pp. 324–339.

Berrou, C., et al., *Near Shannon Limit Error—Correcting Coding and Decoding: Turbo–Codes (1)*; IEEE, 1993, pp. 1064–1070.

Divsalar, D. and Pollara, F., *Serial and Hybrid Concatenated Codes with Applications*; Jet Propulsion Laboratory, California Institute of Technology, pp. 1–8.

Divsalar, D. and Pollara, F., *Turbo Trellis Coded Modulation with Iterative Decoding for Mobile Satellite Communications*; Jet Propulsion Laboratory, California Institute of Technology, pp. 1–7.

Divsalar, D., et al., *Serial Turbo Trellis Coded Modulation with Rate–1 Inner Code*, Jet Propulsion Laboratory, California Institute of Technology, Jun. 2000, p. 194.

Divsalar, D., et al., *Serial Concatenated Trellis Coded Modulation with Rate–1 Inner Code*, IEEE, 2000, pp. 777–782.

Hagenauer, J. and Hoeher, P., *A Viterbi Algorithm with Soft–Decision Outputs and its Applications*; Proceedings of IEEE Globecom '89; Dallas, Texas, Nov. 1989; pp. 47.1.1–47.1.7.

Hoeher, Peter and Lodge, John, *"Turbo DPSK": Iterative Differential PSK Demodulation and Channel Decoding*; IEEE Transactions on Communications, vol. 47, No. 6, Jun. 1999, pp. 837–843.

Narayanan, K. R. and Stüber, G. L., *A Serial Concatenation Approach to Iterative Demodulation and Decoding*; IEEE Transactions on Communications, vol. 47, No. 7, Jul. 1999, pp. 956–961.

Nill, C. and Sundberg, C. W., *List and Soft Symbol Output Viterbi Agorithms: Extensions and Comparisons*, IEEE Transactions on Communications, vol. 43, nos. 2/3/4, Feb./Mar./Apr., pp. 277–287.

Peleg, M. et al., *On Interleaved, Differentially Encoded Convolutional Codes*, IEEE Transactions on Information Theory, vol. 45, No. 7, Nov. 1999, pp. 2572–2582.

Robertson, P., et al., *A Comparison of Optimal and Sub–Optimal MAP Decoding Algorithms Operating in the Log Domain*; IEEE, 1995, pp. 1009–1013.

Viterbi, A., *An Intuitive Justification and a Simplified Implementation of the MAP Decoder for Convolutional Codes*; IEEE Journal on Selected Areas in Communications, vol. 16, No. 2, Feb. 1998, pp. 260–264.

Pietrobon, S.S., *Implementation and Performance of a Turbo/Map Decoder*, International Journal of Satellite Communications, vol. 16, pp. 23–46 (1998).

Robertson, P. and Worz, T., *Extensions of Turbo Trellis Coded Modulation to High Bandwidth Efficiencies*, Institute for Communication Technology, pp. 1251–1255 (1997).

Cherubini, G. and Olcer, S., *Concatenated Coding for Binary Partial–Response Channels*, Zurich Research Laboratory, IBM Research Division, pp. 1789–1794 (1994).

Benedetto, S. et al., *Iterative Decoding of Serially Concatenated Codes with Interleavers and Comparison with Turbo Codes*, GLOBECOM '97, IEEE, vol. 2, pp. 654–658, Nov. 3, 1997.

Jung, P. et al., *Comprehensive Comparison of Turbo–Code Decoders*, Proceedings of $45^{th}$ IEEE Vehicular Technology Conference VTC '95, pp. 624–628, Jul. 25, 1995.

Ngo, T., et al., *Turbo Codes on the Fixed Point DSP TMS320C55x*, 2000 IEEE Workshop on Signal Processing Systems, p. 255–264, Oct. 2000.

Park, G., et al., *An Implementation of a Turbo–Code Decoder Using a Block–Wise MAP Algorithm*, IEEE Proceedings, 2000 Vehicular Technology Conference, vol. 6, pp. 2956–2961, Sep. 2000.

Raghupathy, A., et al., *A Transformation for Computational Latency Reduction in Turbo–Map Decoding*, Proc. IEEE Int. Symp. on Circuits and Systems (ISCAS), pp. IV–402 to IV–405, Jun. 1999.

Vogt, J. et al., *Comparison of Different Turbo Decoder Realizations for IMT–2000*, IEEE Proceedings GLOBECOM '99, vol. 5, pp. 2704–2708, Sep. 5–9, 1999.

Zhipei Chi, et al., *Iterative Decoding of Space–Time Trellis Codes and Related Implementation Issues*, IEEE Proceedings of 2000 Asilomar Conference on Signals, Systems and Computers, 1:29, pp. 562–566, Nov. 2000.

Zhongfeng Wang, et al., *VLSI Implementation Issues of TURBO Decoder Design for Wireless Applications*, Proc. of 1999 IEEE Workshop on Signal Processing Systems: Design and Implementation, pp. 503–512, Oct. 20, 1999.

\* cited by examiner

SYSTEM OF AND METHOD FOR DECODING TRELLIS CODES

RELATED APPLICATIONS

This application is related to co-pending U.S. patent application Ser. No. 10/013,490, filed on even date herewith, U.S. Provisional Application No. 60/386,197, filed Nov. 13, 2001, U.S. Provisional Application No. 60/327,257, filed Oct. 4, 2001, and U.S. Provisional Application No. 60/255, 874, filed Dec. 15, 2000, each of which is owned in common by the assignee hereof, and each of which s fully incorporated by reference herein as though set forth in full.

This application claims the benefit of U.S. Provisional Application No. 60/386,182 filed Nov. 13, 2001, U.S. Provisional Application No. 60/327,258 filed Oct. 4, 2001, and U.S. Provisional Application No. 60/255,797, filed Dec. 15, 2000, each of which is hereby fully incorporated by reference herein as though set forth in full.

FIELD OF THE INVENTION

This invention generally relates to decoders, and, more specifically, to decoders of trellis codes.

RELATED ART

Trellis codes, such as convolutional codes, or parallel or series combinations or concatenations of convolutional codes, are codes which are decoded through use of a trellis. Trellis coded modulation (TCM) codes are groupings of trellis coded bits which result from mapping the bits into symbols, such as MPSK symbols, prior to transmission. The symbols may then be used to modulate a carrier, and the modulated carrier transmitted over a wireline or wireless interface. For additional information on trellis codes, such as serial or parallel concatenated convolutional codes, and TCM codes, such as serial concatenated trellis coded modulation codes (SCTCM) codes, please see U.S. Pat. No. 6,023,783; "Turbo Codes: Analysis, Design, Iterative Decoding and Applications," Course 909, Part II, International Courses for Telecom and Semiconductor Professionals, S. Benedetto & D. Divsalar, Oct. 25–29, 1999, Barcelona, Spain, pp. 324–339; "A Serial Concatenation Approach to Iterative Demodulation and Decoding," K. Narayanan et al., IEEE Transactions on Communications, Vol. 47, No. 7, July 1999; "'Turbo DPSK': Iterative Differential PSK Demodulation and Channel Decoding," P. Hoeher et al., IEEE Transactions on Communications, Vol. 47, No. 6, June 1999; "Serial and Hybrid Concatenated Codes with Applications," D. Divsalar et al., Proc. Int. Symp. Turbo Codes and Appls., Brest, France, September 1997, pp. 80–87; "Turbo Trellis Coded Modulation With Iterative Decoding for Mobile Satellite Communications," D. Divsalar et al., Proc. Int. Mobile Satellite Conf., June 1997; "Serial Concatenated Trellis Coded Modulation with Iterative Decoding: Design and Performance," submitted to IEEE Comm. Theory Mini Conference 97 (Globecom 97); "Near Shannon Limit Error-Correcting Coding: Turbo Codes," C. Berrou et al., Proc. 1993 IEEE International Conference on Communications, Geneva, Switzerland, pp. 1064–1070, May 1993; and "A Soft-Input Soft-Output Maximum A Posteriori (MAP) Module to Decode Parallel and Serial Concatenated Codes," S. Benedetto, TDA Progress Report 42-127, Nov. 12, 1996, each of which is hereby fully incorporated by reference herein as though set forth in full.

Decoders of trellis codes may be configured for computing soft or hard estimates of the underlying source bits or the encoded symbols, or for computing extrinsic outputs for the underlying source bits or encoded symbols, i.e., soft or hard estimates with a priori information about the bits or symbols removed. Various forms of decoders are possible including, for example, maximum a posteriori (MAP) decoders, log-MAP decoders, MAX-Log-MAP decoders, Viterbi decoders, Soft Output Viterbi (SOVA) decoders, A Posteriori Probability (APP) decoders, Soft List Viterbi (Soft-LVA) decoders, etc. For additional information on these decoders, please see "Optimal Decoding of Linear Codes for Minimizing Symbol Error Rate," L. R. Bahl et al., IEEE Transactions on Information Theory, March 1974, pp. 27–30; "Near Shannon Limit Error-Correcting Coding and Decoding: Turbo Codes," C. Berrou et al., Proc. ICC '93 Geneva, Switzerland, May 1993, pp. 1064–1070; "An Intuitive Justification and a Simplified Implementation of the MAP Decoder for Convolutional Codes," A. Viterbi, IEEE Journal On Selected Areas In Telecommunications, Vol. 16, No. 2, February 1998, pp. 260–264; S. Benedetto et al., "A Soft-Input Soft-Output Maximum A Posteriori (MAP) Module to Decode Parallel and Serial Concatenated Codes," TDA Progress Report 42-127, Nov. 15, 1996, pp. 1–20; D. Divsalar et al., "Turbo Trellis Coded Modulation with Iterative Decoding for Mobile Satellite Communications," Proc. Int. Mobile Satellite Conf., June 1997; "A Comparison of Optimal and Sub-Optimal MAP Decoding Algorithms Operating in the Log Domain," Proc. IC '95, Seattle, Wash. 1995, pp. 1009–1013; J. Hagenauer & P. Hoeher, "A Viterbi Algorithm With Soft-Decision Outputs and its applications," Proceedings of IEEE GLOBECOM, Dallas, Tex. sec. 47.1.1–47.1.7 (1989); U.S. Pat. No. 5,181,209; C. Nill & C. E. Sundberg, "List and Soft Symbol Output Viterbi Algorithms: Extensions and Comparisons," IEEE Transactions on Communications, vol. 43, nos. 2/3/4, pp. 277–87 (February March April 1995); and U.S. Pat. No. 5,537,444, each of which is hereby fully incorporated by reference herein as though set forth in full.

Known decoders of TCM codes are configured to handle QPSK symbols, but are susceptible to performance limitations in applications involving MPSK or QAM symbols beyond QPSK. The problem is particularly acute in applications involving log-MAP decoders, in which probabilities are expressed in the natural log domain. The computations needed to perform log-domain calculations places additional demands on the decoders.

SUMMARY

The invention provides ba system for determining one or more state probabilities for one or more states in a trellis representation. In one embodiment of the system, branch metric logic determines branch metrics for one or more of the branches between one or more states in a first portion of the trellis and one or more states in a second portion of the trellis, and state probability logic determines state probabilities for one or more of the states.

The state probability logic in this embodiment groups one or more of the branches into groups. This state probability logic also performs, for one or more of the groups, a first group operation on one or more of the branch metrics for the branches in the group to determine a group value for the group; and then updates, for one or more of the groups, the group value for the group based on one or more previously determined state probabilities. This first group operation may be but is not limited to the MAX* operation.

This state probability logic also performs, for one or more of the states, a second group operation on one or more of the updated group values. This second group operation may be but is not limited to the MAX* operation.

In a second embodiment, the state probability logic comprises p state probability logic modules for determining in parallel state probabilities for each of p states, where p is an integer of two or more.

In this embodiment, each of the p modules groups one or more of the branches into groups. Each of the p modules performs, for one or more of the groups, a first group operation on one or more of the branch metrics for branches in the group to determine a group value for the group; and then updates, for one or more of the groups, the group value for the group based on one or more previously determined state probabilities.

Each of the p modules also performs a second group operation on one or more of the updated group values to determine a state probability for the state.

Normalization logic may also be included in this second embodiment for normalizing one or more of the p state probabilities as determined in parallel by the p modules. In one implementation, this logic functions by determining the maximum state probability of one or more of the p states, and subtracting the same from one or more of the p state probabilities.

The invention also provides a system for determining branch metrics. First logic determines a first correlation value representing the level of correlation between one or more symbols and one or more symbols associated with a branch. Second logic determines a second correlation value representing the level of correlation between one or more a priori probabilities and one or more bits associated with the branch. Third logic derives a branch metric for the branch from the first and second correlation values.

The invention also provides a system for determining an estimate or extrinsic output of one or more bits using a trellis representation. In this trellis representation, there are one or more branches between one or more states in a first portion of the trellis and one or more states in a second portion of the trellis. One or more of the states in the first portion of the trellis have forward state probabilities, and one or more of the states in the second portion of the trellis have backward state probabilities. Also, one or more of the branches have branch metrics.

In one embodiment, first logic in the system groups one or more of the branches into groups. Second logic in this embodiment performs, for one or more of the groups, a group operation on one or more of the branch metrics for the branches in the group to determine a group value for the group. This group operation may be but is not limited to the MAX* operation.

Third logic in the system updates, for one or more of the groups, the group value for the group based on one or more state probabilities and, possibly, one or more a priori probabilities for the input bits.

Fourth logic in the system derives a first value from one or more of the updated group values for groups which imply release of a logical "1" for the bit in question, derives a second value from one or more of the updated group values for groups which imply release of a logical "0" for the bit in question, and determines an estimate of or extrinsic output for the bit in question from the first and second values.

The invention further provides a system for computing the MAX* of operands A and B. In one embodiment, first logic in the system tests the difference A−B relative to zero, and outputs a signal indicative thereof.

Second logic in the system determines the maximum of the operands A and B, MAX(A,B), by outputting a signal representative of the operand A if the signal from the first logic indicates that the difference A−B is greater than zero, and outputs a signal representative of the operand B otherwise.

Third logic in the system determines the absolute value of A−B by outputting a signal representative of the difference A−B if the signal from the first logic indicates that the difference A−B is greater than zero, and outputs a signal representative of the difference B−A otherwise.

Fourth logic outputs a value corresponding to $\ln(1+\exp(-|A-B|))$ by retrieving the value from a lookup table using as an argument a value derived from the absolute value of A−B.

Fifth logic determines a value corresponding to $MAX(A,B)+\ln(1+\exp(-|A-B|))$ from signals derived from the outputs of the second and fourth logic, and outputs a signal indicative thereof.

The invention also provides a system for performing a MAX* $2^p$->1 operation, where p is an integer of two or more. In one embodiment, the system comprises a hierarchical arrangement of MAX* 2->1 logic modules having p levels, ranging from 1, the highest level, to p, the lowest level, wherein a level q, $1 \leq q \leq p$, of the hierarchy comprises $2^{(p-q)}$ MAX* 2->1 logic modules configured in parallel.

The invention further provides a system for computing one or more forward state probabilities or one or more backward state probabilities in a trellis representation. This trellis representation has one or more branches between one or more states in a first portion of the trellis and one or more branches in a second portion of the trellis.

In one embodiment, branch metric logic in the system computes one or more branch metrics for one or more of the branches, and indication logic in the system indicates whether the system is configured to compute forward state probabilities or backward state probabilities.

State probability logic in the system (1) computes one or more forward state probabilities for one or more states in the second portion of the trellis, provided the indication logic indicates the system is configured to compute forward state probabilities; and (2) computes one or more backward state probabilities of one or more states in the first portion of the trellis, provided the indication logic indicates the system is configured to compute backward state probabilities.

The system may further include estimation/extrinsic output logic for computing an estimate of or extrinsic output for one or more bit responsive to one or more state probabilities, one or more branch metrics, and, possibly, one or more a priori probabilities for the bits. In one implementation, the backward state probability for a state may be computed by grouping the branches exiting the state according to the state at which the branches terminate, determining for each group exiting the state a group value based on the branch metrics for the branches in the group, and then determining the backward state probability for the state responsive to the group values for one or more of the groups exiting the state and one or more of the backward state probabilities of the successor states of the groups.

The forward state probability for a state in this implementation may be computed by grouping the branches entering the state according to the state at which the branches originate, determining for each group entering the state a group value based on the branch metrics for the branches in the group, and then determining the forward state probability for the state responsive to the values of one or more of the groups entering the state and one or more of the forward state probabilities of the predecessor states of the groups.

The estimates or extrinsic outputs in this implementation may be computed one bit at a time. For a particular bit, the branches for the corresponding portion of the trellis may first be grouped according to the origination and termination states, and whether the branch implies release of a logical "1" or a logical "0". Then, a group value may be determined for each group based on the branch metrics for the branches in the group. An estimate of or extrinsic output of the bit may then be determined responsive to the group values, the forward state probabilities of the predecessor states of the groups, the backward state probabilities of the successor states of the groups, and possibly the a priori probabilities of the bits. This process may then be repeated for each of the bits.

In one implementation example, the system is part of a log-MAP decoder, and there are only two states in the trellis at a time. In this implementation example, the branches exiting a particular state can be divided into two groups: those which terminate at the first state in a successive time period, and those which terminate at the second state in a successive time period. The backward state probability for a particular state may be computed by first determining for each group exiting the state the MAX* of the branch metrics for all the branches in the group.

Then, the MAX* value for the first group is added to the backward state probability of the state at which the branches in the first group terminate, and the MAX* value for the second group is added to the backward state probability of the state at which the branches in the second group terminate. The backward state probability for the state in question may then be derived from the MAX* of these two values.

In this implementation example, the branches entering a particular state can also be divided into two groups: those which originate at the first state in a previous time period, and those which originate at the second state in a previous time period. The forward state probability for a particular state may be computed by first determining for each group entering the state a MAX* value of the branch metrics for all the branches in the group.

Then, the MAX* value for the first group may be added to the forward state probability of the state at which the branches in the group originate, and the MAX* value for the second group may be added to the forward state probability of the state at which the branches in the group originate. The forward state probability for the state in question may then derived from the MAX* of these two values.

In this implementation example, once the forward and backward state probabilities for a portion of the trellis have been computed, the extrinsic outputs may be computed one bit at time. The branches in the section of the trellis may be divided into groups according to their origination and destination states, and whether the branch implies release of a logical "1" or "0". A maximum of eight groupings are possible. The MAX* of each grouping is then computed and added to the forward state probability for the originating state for the group, and added to the backward state probability for the terminating state for the group. After subtracting out the a priori probability for the bit in question, the result is a group value assigned to the group.

A first value may then be derived from the MAX* of the group values for the four groups which imply a release of logical "1", and a second value may be derived from the MAX* of the group values for the four groups which imply a release of logical "0". The second value may be subtracted from the first to form an extrinsic output for the bit in question. This process may then repeated for each of the k input bits.

Method counterparts to each of these systems are also provided. Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Example Application

An example application of a system for decoding TCM symbols according to the invention will first be described followed by a discussion of the system itself. This example application is included in order to provide context and aid in understanding the invention. However, many other applications of the invention are possible. Therefore, the inclusion of this application should not be construed as limiting.

Figure 1:
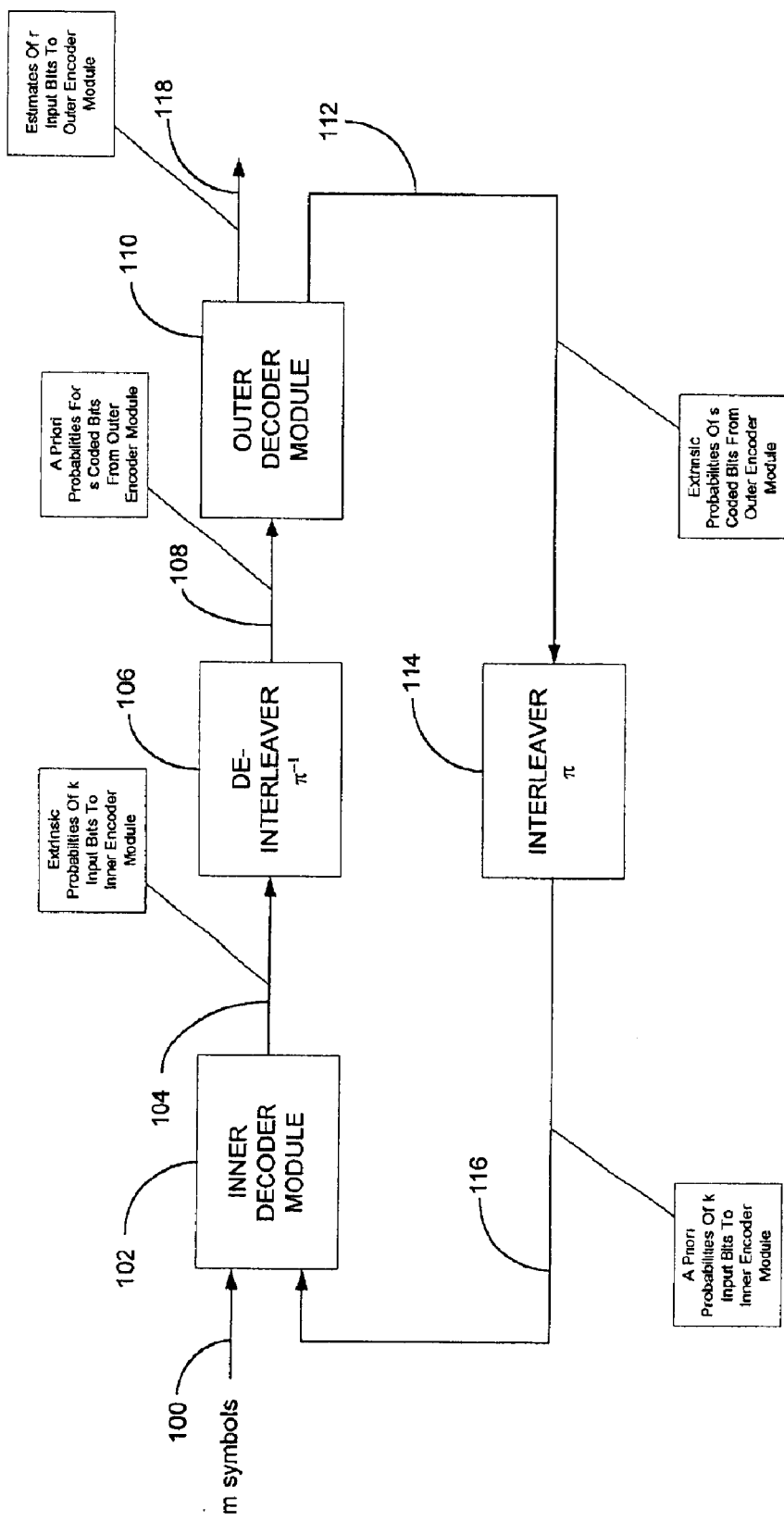
FIG. 1 is a block diagram of one example of a decoder of serial concatenated TCM codes.

The particular application which will be described is an application involving a decoder of serially concatenated trellis coded modulation (SCTCM) symbols as illustrated in FIG. 1, although it should be appreciated that other applications are possible, such as applications involving decoders of non-concatenated TCM codes, and decoders of parallel concatenated TCM codes.

As illustrated, m encoded symbols are input to inner decoder module 102 over one or more signal lines 100, where m is an integer of one or more. The symbols may be represented in quadrature form, i.e., in the form of two dimensional in-phase (I) and quadrature (Q) components, although other forms of representation are possible. The quadrature form of representation is convenient since the I and Q components of a symbol may be simultaneously represented as a single point or number on a complex I-Q plane. Therefore, in the ensuing discussion, this form of representation may be assumed unless otherwise noted.

These m symbols may have been produced by a suitable encoder, such as an SCTCM encoder, and then perturbed by noise through transmission over a wireless or wireline transmission channel. An embodiment of an SCTCM encoder is illustrated in FIG. 3, and this encoder will now be explained in order to provide additional context for understanding the operation of the decoder illustrated in FIG. 1.

Figure 3:
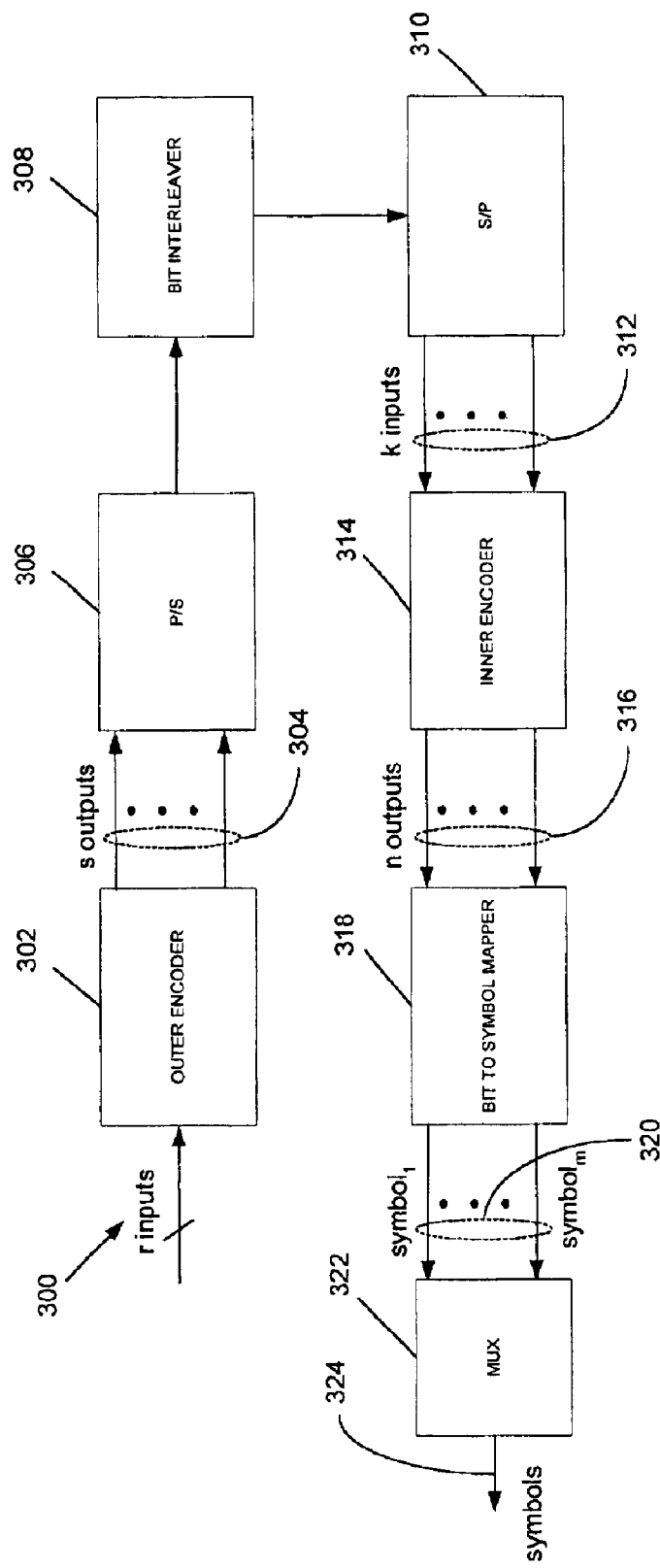
FIG. 3 is a block diagram of an encoder which corresponds to the decoder of FIG. 1.

As illustrated in FIG. 3, the encoder comprises the series combination of outer encoder module 302, parallel-to-serial converter 306, bit interleaver 308, serial-to-parallel converter 310, inner encoder module 314, bit to symbol mapper 318, and symbol multiplexor 322. As shown, outer encoder module 302 is assumed to be a rate r/s convolutional encoder, receiving r input bits over one or more signal lines 300, and producing therefrom s parallel output bits over one or more signal lines 304, where both r and s are integers of one or more. Parallel-to-serial (P/S) converter 306 serializes the s parallel bits output by outer encoder module 302, bit interleaver 308 interleaves these bits, and serial-to-parallel converter 310 converts the serial bit stream from interleaver 308 into successive renditions of k bits each. Inner encoder module 314 is assumed to be a rate k/n convolutional encoder, receiving in parallel over one or more signal lines 312 k input bits and producing therefrom in parallel n output bits on one or more signal lines 316, where both k and n are integers of one or more. Bit to symbol mapper 318 converts each n bit rendering from inner encoder module 314 into m symbols, where m is also an integer of one or more. If the symbols are represented in quadrature form, the mapper 318 may output the m symbols in the form of 2m symbol components for each n bit rendering from module 314. The m symbols may then be serialized onto signal line 324 through multiplexor 322. If the symbols are represented in quadrature form, the 2m symbol components may be serialized onto signal line 324 two symbol components at a time.

Figure 4A:
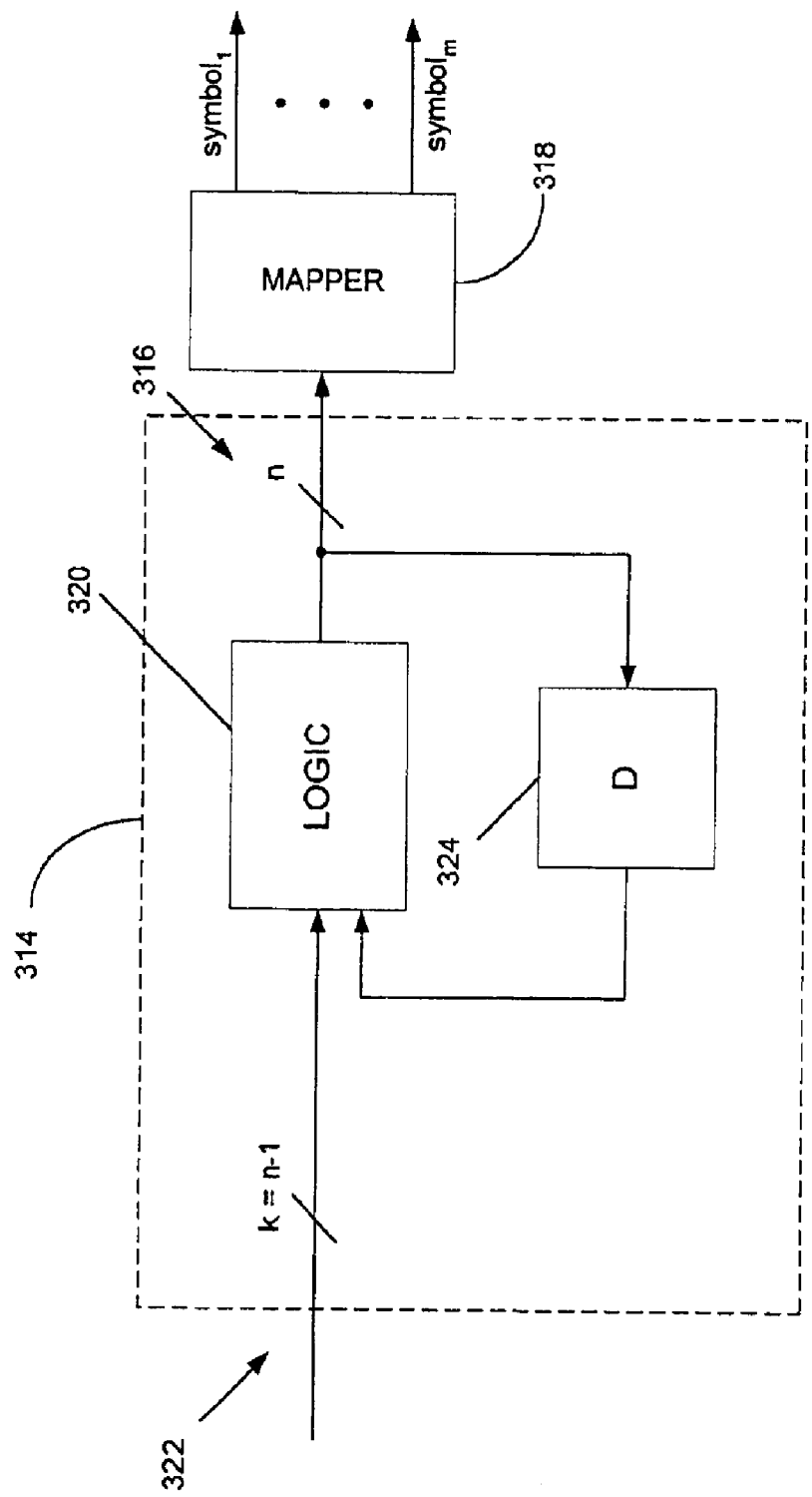
FIG. 4A is a block diagram of one example of the inner encoder module of the encoder of FIG. 3.

An example of inner encoder module 314 and bit to symbol mapper 318 is illustrated in FIG. 4A. As illustrated, in this example, module 314 comprises a rate k/n convolutional encoder where n=k+1 and where only one storage register is employed. However, it should be appreciated that other examples and embodiments are possible, including examples where n≠k+1, where n=k, where n≧k+1, and where more than one storage register is employed. Therefore, the inclusion of this example should not be construed as limiting.

Module 314 in this example comprises logic 320 and storage register 324. The k inputs to module 314, identified with numeral 322, are input to logic 320. Another input to logic 320 is formed from the output of storage register 324. The n outputs of module 314, identified with numeral 316, are output from logic 320. One or more of these n outputs may comprise one of the k inputs passed through unaltered. The n outputs are of module 314 are input to mapper 318.

Figure 4B:
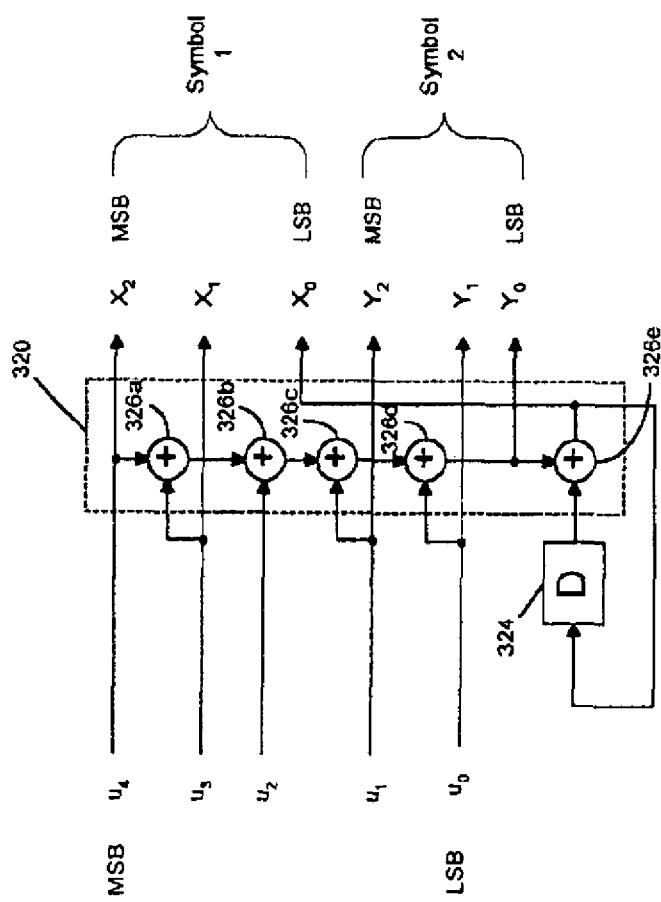
FIG. 4B is a block diagram of one example implementation of the inner encoder portion of the module of FIG. 4A.
Figure 5:
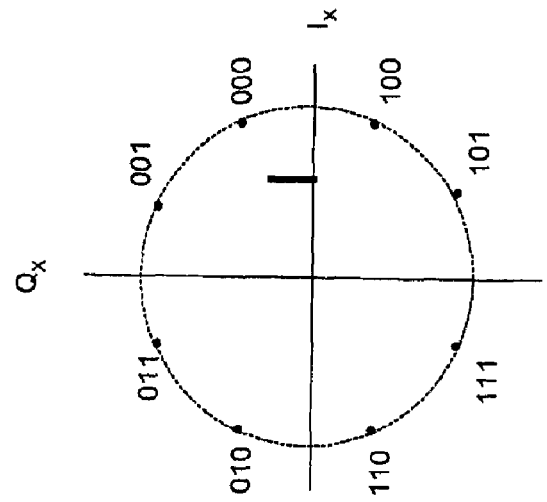
FIG. 5 are constellations illustrating one example of a four dimensional bit to 8-PSK symbol mapping.
Figure 5:
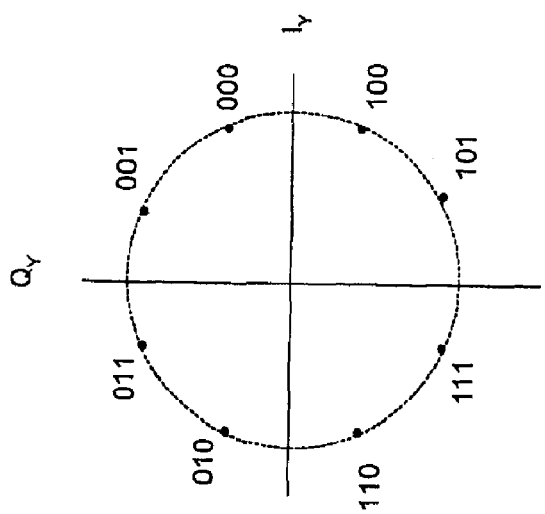

Consider a particular implementation of the particular inner encoder module 314 illustrated in FIG. 4A where k=5. Such an implementation is illustrated in FIG. 4B. As illustrated, logic 320 comprises five two-input exclusive OR modules 326a, 326b, 326c, 326d, and 326e (or equivalently modulo 2 modules. Four of the input bits, $u_0$, $u_1$, $u_3$, and $u_4$, are passed through unaltered to respectively form output bits $Y_1$, $Y_2$, $X_1$, and $X_2$. One of the output bits, $Y_0$, is derived from the modulo two addition of all five input bits, $u_0$, $u_1$, $u_2$, $u_3$, and $u_4$. Another of the output bits, $X_0$, is derived from the modulo two addition of $Y_0$ and the output of storage register 324. In this particular implementation, mapper 318 may map each 6 bit output of inner encoder module 314 into two 8-PSK symbols. As illustrated, the output bits $X_0$, $X_1$, and $X_2$ are mapped into a first symbol, and the output bits $Y_0$, $Y_1$, and $Y_2$ are mapped into a second symbol. One example of such a mapping is illustrated in FIG. 5. In this particular example, each 3 bit grouping within the 6 bit output is mapped into a separate 8-PSK symbol. Moreover, a Gray scale mapping is employed, whereby the 3 bit groupings for adjacent symbols differ by a single bit. The I and Q components for the first symbol may be represented as $I_X$ and $Q_X$, and the I and Q components for the second symbol may be represented as $I_Y$ and $Q_Y$. It should be emphasized that this particular implementation is provided by way of illustration only, and that other examples are possible in which any number of bit groupings or subgroupings are mapped into one or more MPSK or QAM symbols, including BPSK, QPSK, 8-PSK, 16-QAM, 64-QAM, and beyond.

Turning back to FIG. 1, the discussion of the operation of the decoder there illustrated will be continued. Besides the m symbols which are input on one or more signal lines 100, inner decoder module 102 receives as an input over one or more signal lines 116 a priori probabilities of each of the k input bits to the inner encoder module 314 of FIG. 3. Responsive to this information, inner decoder module 102 outputs on one or more signal lines 104 the extrinsic probabilities of each of the k input bits to the inner encoder module 314. In one embodiment, these extrinsic probabilities may be log likelihood ratios that comprise soft estimates of these input bits.

De-interleaver 106 receives the k extrinsic probabilities and de-interleaves them to form a priori probabilities of each of the s coded bits output from the outer encoder module 302 in FIG. 3. Responsive to this information, outer decoder module 110 outputs on one or more signal lines 112 extrinsic probabilities of the s coded bits output from the outer encoder module 302 in FIG. 3. (The other output of outer decoder module 110, comprises estimates of the r input bits to outer encoder module 302.) Again, these s extrinsic probabilities may be derived from soft estimates of the coded bits output from outer encoder module 302.

These s extrinsic probabilities are input to interleaver 114, which interleaves these values to produce, on one or more signal lines 116, the a priori probabilities of the k input bits to the inner decoder module 314. These k a priori probabilities form the second input to inner decode module 102.

The decoder illustrated in FIG. 1 may iterate one or more additional times so that, at the conclusion of these iterations, the estimates of the r input bits to the outer encoder module 302 may be considered reliable. Thus, at this point, the estimates of the r input bits may be taken from the outer encoder module 302.

Figure 2:
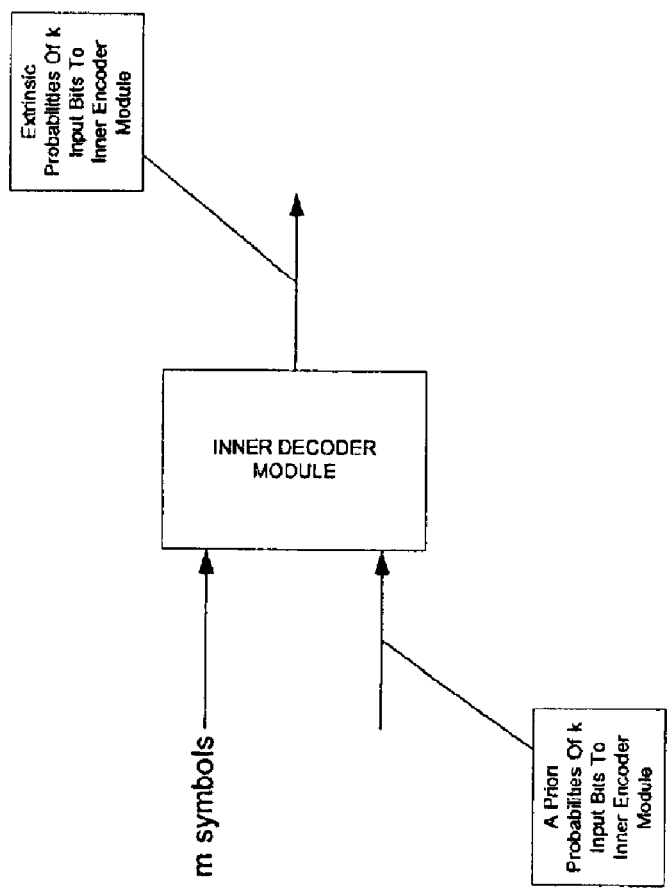
FIG. 2 is a block diagram of the inner decoder module of the decoder of FIG. 1.

The inner decoder module 102 of FIG. 1 is shown as a standalone module in FIG. 2. As shown, this module receives as inputs the m symbols output by mapper 318, and the a priori probabilities of the k input bits to inner encoder module 314 which gave rise to the m symbols. It is this inner decoder module which provides an example application for the system configured in accordance with the subject invention.

In this example, the inner decoder module 102 may comprises one or more forward decoding engines and one or more backward decoding engines, each embodying the system of the invention. These decoding engines may operate concurrently to process incoming blocks of symbols.

Figure 6:
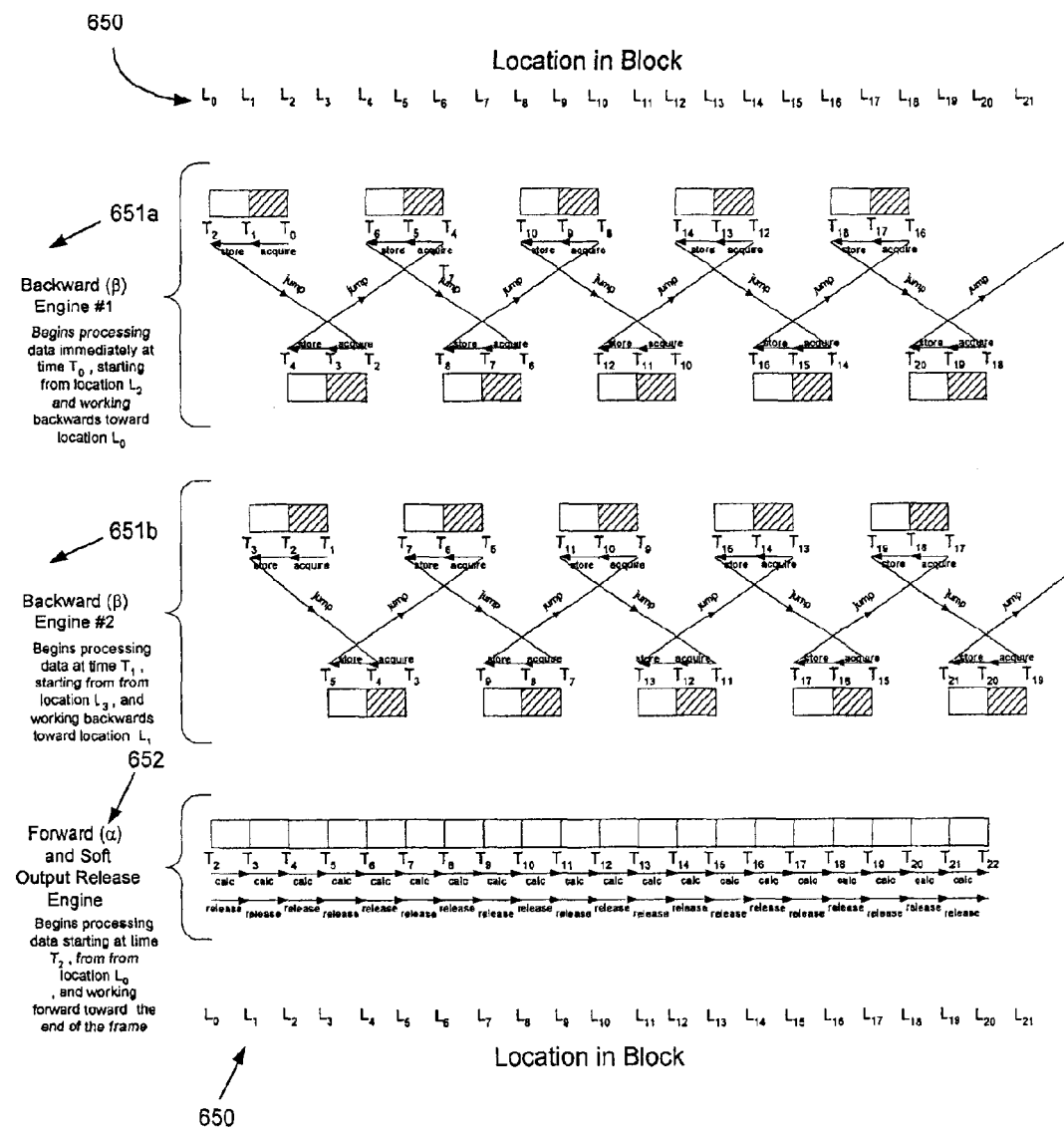
FIG. 6 is a timing diagram illustrating concurrent operation of forward and backward engines according to one example application of a decoding engine according to the invention.

Referring to FIG. 6, in one example, the inner decoder module 102 comprises two backward engines, identified with numerals 651a and 651b, and one forward engine 652, each of which are configured according to the invention. The engines may operate concurrently on portions (sub-blocks) of a block of encoded symbols within a movable sliding window according to the timing diagram illustrated in FIG. 6. The locations within the block of symbols being processed are identified with numeral 650. The sub-blocks are the areas which are demarcated by the locations $L_0$, $L_1$, etc.

The backward engines can begin operating at any portion of the block and will eventually begin producing reliable results, i.e., reliable backward state probabilities, after a certain amount of processing. A rule of thumb is that the backward engines require about 5–6 constraint lengths of processing before they begin producing reliable results. These 5–6 constraint lengths are referred to as the traceback length. Processing by the backward engines over the traceback length is referred to in the figure with the "acquire" label. The period over which the backward engines produce reliable results is referred to in the figure with the "store" label. That is because these results are typically stored in a volatile memory such as RAM. Processing during the traceback length will hereinafter be referred to as "acquire" processing and the subsequent phase in which reliable results are produced will be referred to as "reliable" or "store" processing.

In FIG. 6, it can be seen that the traceback length is equal to the store period over which the backward engine produces reliable results, and both are equal to one sub-block length. However, it should be appreciated that embodiments are possible in which the traceback length is different from the store length, and in which one or both of traceback and store lengths are greater than one sub-block.

The timing and manner in which the backward engines perform their operations in the particular example are indicated in the figure. For example, during time $T_0$–$T_1$, backward engine 651a performs acquire processing of sub-block $L_1$–$L_2$, and during time $T_1$–$T_2$, it performs reliable processing of sub-block $L_0$–$L_1$. Concurrently with these functions, backward engine 651b, during time $T_1$–$T_2$, performs acquire processing of sub-block $L_2$–$L_3$, and during time $T_2$–$T_3$, performs reliable processing of sub-block $L_1$–$L_2$.

Meanwhile backward engine 651a, during time $T_2$–$T_3$, performs acquire processing of sub-block $L_3$–$L_4$, followed, during time $T_3$–$T_4$, by reliable processing of sub-block $L_2$–$L_3$. Concurrently with these functions, backward engine 651b, during time $T_3$–$T_4$, performs acquire processing of sub-block $L_4$–$L_5$, and during time $T_4$–$T_5$, performs reliable processing of sub-block $L_3$–$L_4$.

The backward engines then continue to operate in tandem as illustrated in the figure until the entire block has been processed. Note that, in this exemplary embodiment, reliable results for the sub-blocks are sequentially produced in the same order as the physical sub-blocks. That is to say, during $T_1$–$T_2$, reliable results are produced (by engine 651a) for sub-block $L_0$–$L_1$. Then, during time $T_2$–$T_3$, reliable results are produced (by engine 651b) for sub-block $L_1$–$L_2$. This is followed by time $T_3$–$T_4$, when reliable results are produced (by engine 651a) for sub-block $L_2$–$L_3$. This is followed by time $T_4$–$T_5$, when reliable results are produced (by engine 651b) for sub-block $L_3$–$L_4$. The process then continues in this fashion as illustrated in the figure.

The forward engine 652 operates in tandem with the completion of processing of reliable backward state probabilities for the various sub-blocks. That is to say, after reliable backward state probabilities are determined for sub-block $L_0$–$L_1$ during time $T_1$–$T_2$, the forward engine 652 performs, during time $T_2$–$T_3$, the calculation of forward state probabilities for sub-block $L_0$–$L_1$. At the same time, or synchronized with the calculation of the forward state probabilities, the forward engine 652 may use the immediately available forward state probabilities and the stored backward state probabilities to calculate and release soft outputs for sub-block $L_0$–$L_1$. Then, after reliable backward state probabilities are determined for sub-block $L_1$–$L_2$ during time $T_2$–$T_3$, the forward engine 652 performs, during time $T_3$–$T_4$, the calculation of forward state probabilities for sub-block $L_1$–$L_2$. At the same time, or synchronized with the calculation of the forward state probabilities, the forward engine 652 may calculate and release soft outputs for sub-block $L_1$–$L_2$. The process then continues in the same manner until soft outputs for the entire block have been released. Note that the order in which the forward engine 652 processes sub-blocks to compute forward state probabilities and release soft outputs in this example is the same as the physical order of the sub-blocks.

Note also that the latency in this example, in terms of traceback lengths, is equal to four. This is the delay between the time the system began acquire processing of a sub-block and the time the system completed the release of soft outputs for that sub-block. For example, consider sub-block $L_1$–$L_2$. The system began acquire processing of this sub-block at time $T_0$. Yet, it did not complete the release of soft outputs for that sub-block until time $T_4$. Since each time period is assumed equal to a traceback length in this example, the total latency is four traceback lengths.

For additional information on this mode of operation, in which one or more forward and backward engines operate concurrently on sub-blocks within a sliding window, please see co-pending U.S. patent application Ser. No. 09/629,122, filed Jul. 31, 2000, which is hereby fully incorporated by reference herein as though set forth in full.

Description of Embodiments of the Invention

Figure 7A:
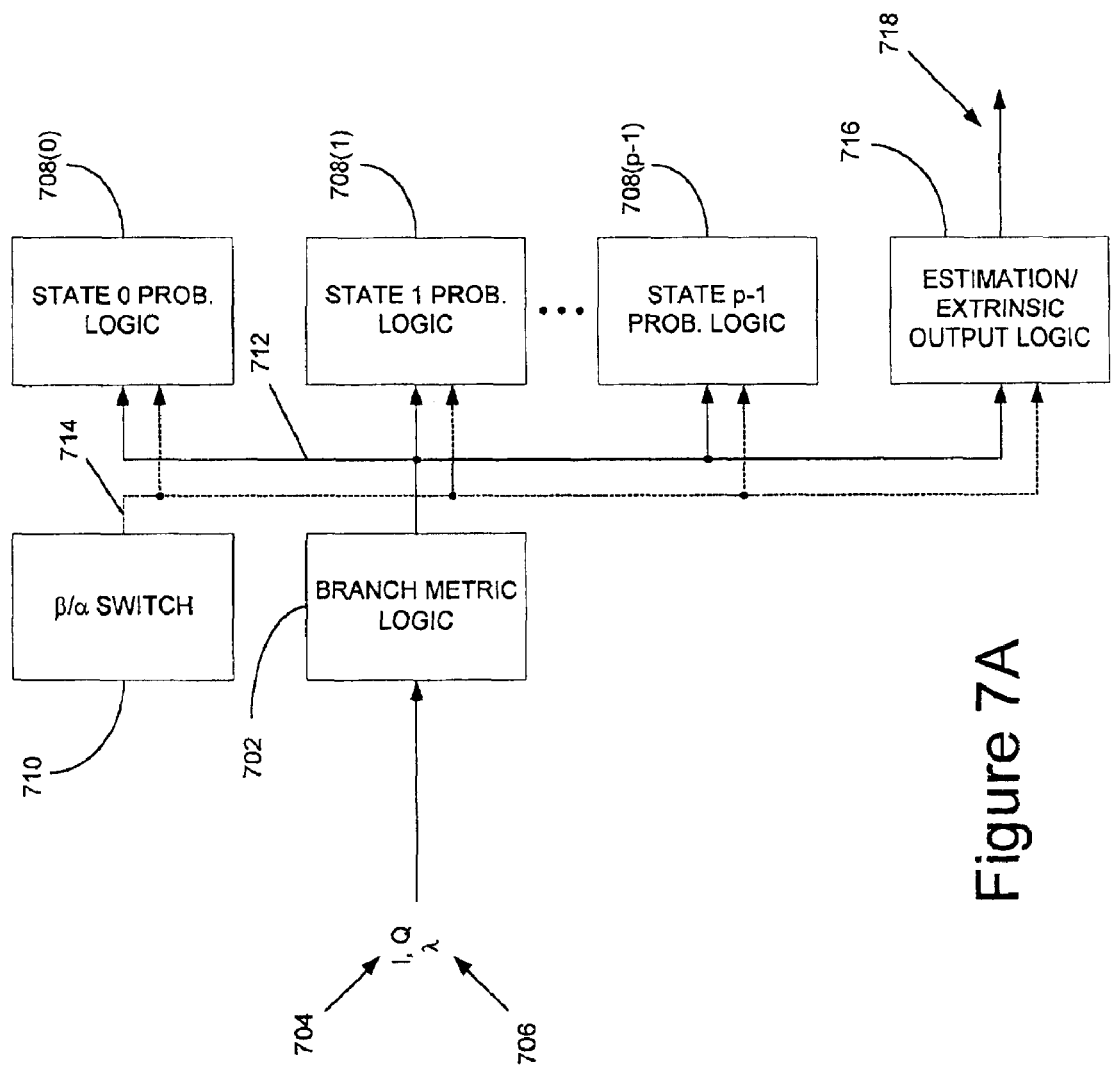
FIG. 7A is a block diagram of a first embodiment of a system for decoding TCM symbols according to the invention.

A first embodiment of a decoding system according to the invention is illustrated in FIG. 7A. In this embodiment, m TCM encoded symbols, identified in the figure with numeral 704, are input to the system along with a priori probabilities for k source bits, identified in the figure with numeral 706, where both m and k are integers of one or more. The m symbols may result from passing the k source bits through a TCM encoder which, for purposes of this disclosure, is the combination of a rate k/n convolutional encoder and a bit to symbol mapper which maps the n output bits from the convolutional encoder into m symbols. (One example of a TCM encoder is the combination of inner encoder module 314 and mapper 318 in FIG. 3, but it should be appreciated that a TCM encoder is not limited to serving as the inner encoder in a SCTCM encoder, and that other applications are possible, including where the TCM encoder operates in a standalone mode.) The symbols may also have been transmitted over a wireless or wireline communications channel prior to being input to the system.

Responsive to these inputs, branch metric logic 702 within the system computes branch metrics for one or more of the branches in a trellis which corresponds to the TCM encoder which gave rise to the m symbols input to the engine. Generally speaking, the branch metric for a branch involves a measure of the correlation between the k inputs bits corresponding to the branch and the k a priori probabilities input to the engine, and also the correlation between the m symbols corresponding to the branch and the m symbols input to the system.

The number of states in the trellis at a particular point in time may be represented as p, where p is equal to two raised to the lth power, where l is the number of storage registers in the corresponding TCM encoder. Thus, for example, if the encoder has one storage register, there will be two states in the trellis at a particular time. Similarly, if the engine has two storage registers, there will be four states in the trellis at a particular time.

A plurality of logic modules, identified with numerals 708(0), 708(1), ..., 708(p1), are provided for computing backward or forward state probabilities for the states in the trellis. In one embodiment, p modules are provided, one for each of the p states in the trellis. These p modules are configured to compute in parallel the state probabilities of each of the p states in the trellis. However, it should be appreciated that other embodiments are possible where less or more than p modules are provided, where the modules compute in parallel less than p of the state probabilities, or where some or all of the state probabilities are computed in parallel.

Optionally, the system may function as either a forward engine or a backward engine. In one embodiment, β/α switch 710 is provided to indicate the particular mode of operation in which the engine is functioning, whether forward recursion mode or backward recursion mode. In this embodiment, each of the p modules 708(0), 708(1), ... 708(p-1) may be configured to recursively compute forward or backward state probabilities depending on the state of β/α switch 710, which may be indicated to each of the modules over one or more signal lines 714. If the switch 710 indicates the backward (or β) mode of operation, the modules may respond by computing backward state probabilities. Conversely, if the switch 710 indicates the forward (or α) mode of operation, the modules may respond by computing forward state probabilities.

If the system is functioning as a backward recursion engine, the modules recursively compute, in parallel, a backward state probability for one or more of the p states. The backward state probabilities may be computed responsive to one or more of the branch metrics and one or more of the state probabilities of successor states.

If the system is functioning as a forward recursion engine, the modules recursively compute, in parallel, a forward state probability for one or more of the p states. The forward state probabilities may be computed responsive to one or more of the branch metrics and one or more of the state probabilities of predecessor states.

Estimation/extrinsic output logic 716 computes estimates or extrinsic outputs for the k underlying source bits responsive to one or more of the forward and backward state probabilities, one or more of the branch metrics, and, possibly, one or more of the a priori probabilities. These estimates or extrinsic outputs may be output over one or more signal lines 718.

In one embodiment, the estimation/extrinsic output logic 716 may be enabled only when the system is functioning as a forward engine. In this embodiment, the mode of operation of the system, whether forward or backward, may be provided to the logic 716 over one or more signal lines 714. If the switch indicates a backward mode of operation, the logic 716 may be disabled. If the switch indicates a forward mode of operation, the logic 716 may be enabled.

In one implementation, the backward state probability for a state may be computed by grouping the branches exiting the state according to the state at which the branches terminate, determining for each group a group value based on the branch metrics for the branches in the group, and then determining the backward state probability for the state responsive to the group values for one or more of the groups and one or more of the backward state probabilities of the successor states of the groups.

In one implementation example, the group value for a group may be derived from the MAX* of the branch metrics for all the branches in the group. The MAX* of two values A and B may be represented as follows:

$$\text{MAX}^*(A,B) = \text{MAX}(A,B) + \ln(1+\exp(-|A-B|)) \tag{1}$$

Since the MAX* operation is associative, the MAX* of three or more values in a group may be performed through successive application of the MAX* operation on pairs of values. For example, the MAX* of A, B, and C may be computed as follows:

$$\text{MAX}^*(A,B,C) = \text{MAX}^*(\text{MAX}^*(A,B),C) \tag{2}$$

Similarly, the MAX* of A, B, C, and D may be computed as follows:

$$\text{MAX}^*(A,B,C,D)=\text{MAX}^*(\text{MAX}^*(A,B,C),D) \quad (3)$$

Figure 8A:
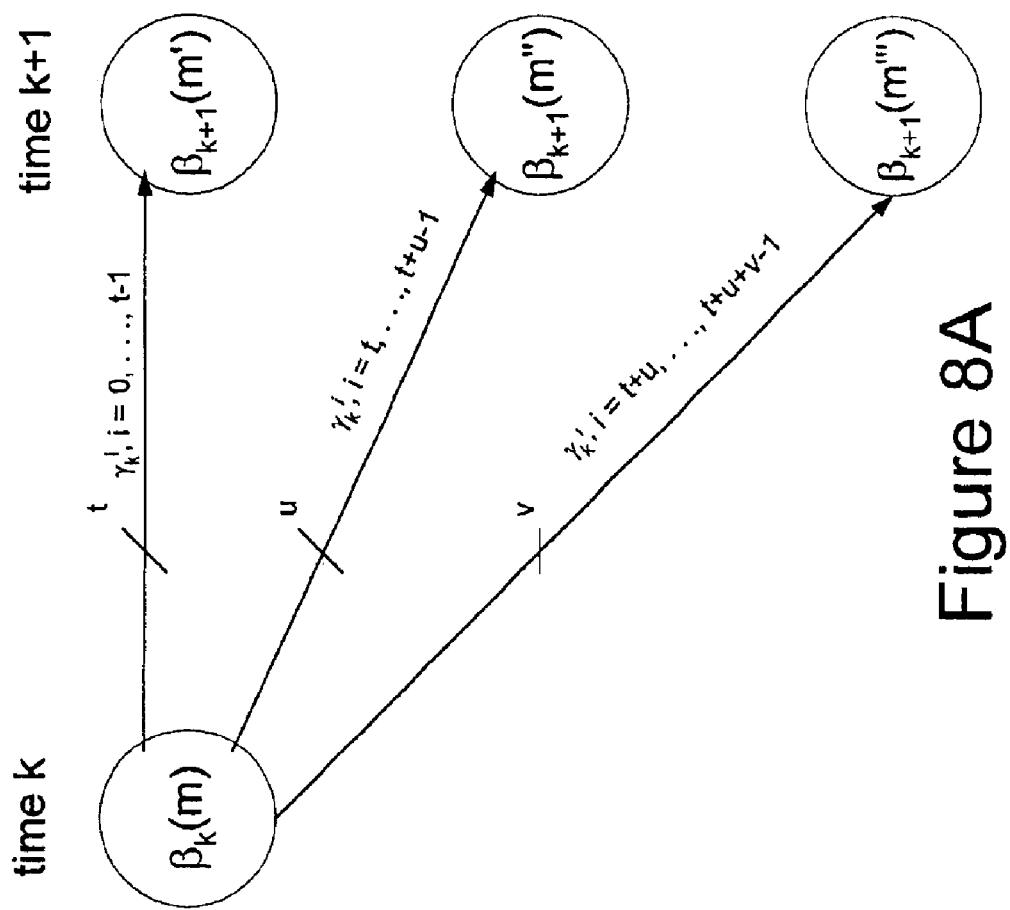
FIG. 8A is a portion of trellis illustrating the computation of backward state probabilities according to embodiment of the invention.

The foregoing may be illustrated in FIG. 8A in the context of an example in which the backward state probability for state m at time k, $\beta_k(m)$, is to be computed. It is assumed that t branches originate from state m at time k and terminate at state m' at time k+1, that u branches originate from state m at time k and terminate at state m" at time k+1, and that v branches originate from state m at time k and terminate at state m'" at time k+1.

The backward state probability for state m' at time k+1, $\beta_{k+1}(m')$, the backward state probability for state m" at time k+1, $\beta_{k+1}(m'')$, and the backward state probability for state m'" at time k+1, $\beta_{k+1}(m''')$ are all assumed known. In addition, the branch metrics for the t branches originating at state m at time k and terminating at state m' at time k+1, $\gamma_k^i$, $0 \leq i \leq t-1$; the branch metrics for the u branches originating at state m at time k and terminating at state m" at time k+1, $\gamma_k^i$, $t \leq i \leq t+u-1$; and the branch metrics for the v branches originating at state m at time k and terminating at state m'" at time k+1, $\gamma_k^i$, $t+u \leq i \leq t+u+v-1$, are all assumed known.

The branches originating from state m at time k are first grouped according to the state at which the branches terminate. Thus, the t branches terminating at state m' are grouped together; the u branches terminating at state m" are grouped together; and the v branches terminating at state m'" are grouped together.

A first group value may then be computed responsive to one or more of the branch metrics in the first group, $\gamma_k^i$, $0 \leq i \leq t-1$. A second group value may be computed responsive to one or more of the branch metrics in the second group, $\gamma_k^i$, $t \leq i \leq t+u-1$. A third group value may be computed responsive to one or more of the branch metrics in the third group, $\gamma_k^i$, $t+u \leq i \leq t+u+v-1$.

In the previously discussed implementation example employing the MAX* operator, the first value group may be derived from $\text{MAX}^*(\gamma_k^i, \forall i, 0 \leq i \leq t-1)$; the second group value may be derived from $\text{MAX}^*(\gamma_k^i, \forall i, t \leq i \leq t+u-1)$; and the third group value may be derived from $\text{MAX}^*(\gamma_k^i, \forall i, t+u \leq i \leq t+u+v-1)$.

The backward state probability $\beta_k(m)$ may then be derived from the first, second and third group values and the backward state probabilities of the successor states, $\beta_{k+1}(m')$, $\beta_{k+1}(m'')$, and $\beta_{k+1}(m''')$, respectively.

In one implementation example, the backward state probability $\beta_k(m)$ may be derived from $\text{MAX}^*[(\beta_{k+1}(m')+\text{MAX}^*(\gamma_k^i, \forall i, 0 \leq i \leq t-1)), (\beta_{k+1}(m'')+\text{MAX}^*(\gamma_k^i, \forall i, t \leq i \leq t+u-1)), (\beta_{k+1}(m''')+\text{MAX}^*(\gamma_k^i, \forall i, t+u \leq i \leq t+u+v-1))]$.

In one implementation, the forward state probability for a state may be computed by grouping the branches entering the state according to the state at which the branches originate, determining for each group a group value based on the branch metrics for the branches in the group, and then determining the forward state probability for the state responsive to the values for one or more of the groups and one or more of the forward state probabilities of the predecessor states of the groups. In one implementation example, the group value for a group may be derived from the MAX* of the branch metrics for all the branches in the group.

Figure 8B:
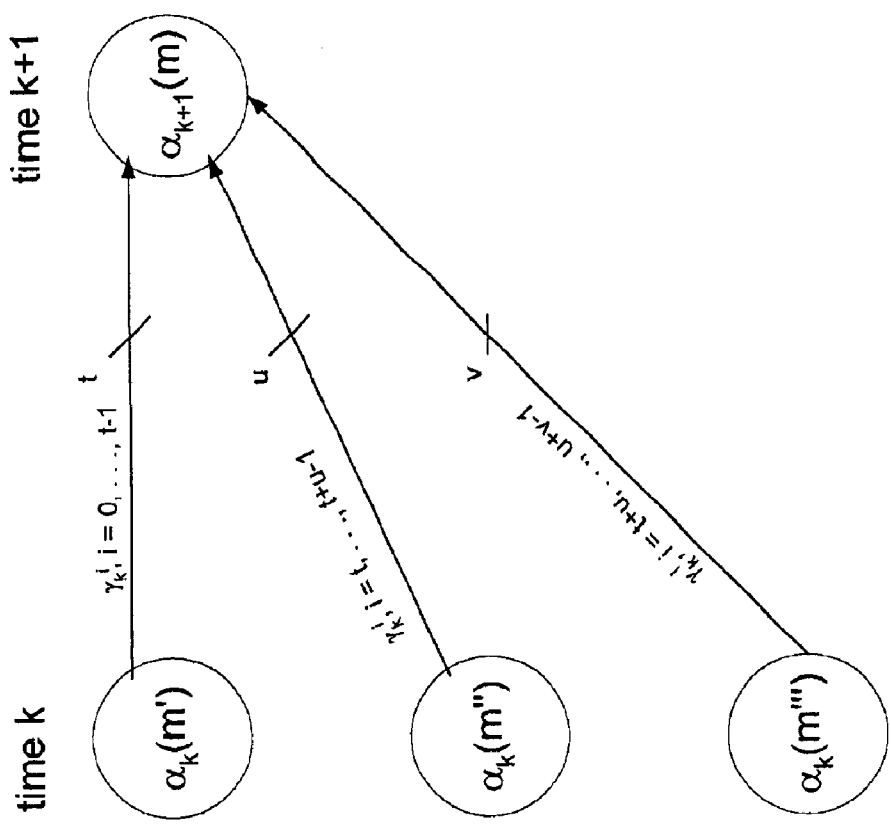
FIG. 8B is a portion of a trellis illustrating the computation of forward state probabilities according to one embodiment of the invention.

The foregoing may be illustrated in FIG. 8B in the context of an example in which the forward state probability for state m at time k+1, $\alpha_{k+1}(m)$, is to be computed. It is assumed that t branches originate at state m' at time k and terminate at state m at time k+1, that u branches originate from state m" at time k and terminate at state m at time k+1, and that v branches originate from state m'" at time k and terminate at state m at time k+1.

The forward state probability for state m' at time k, $\alpha_k(m')$, the forward state probability for state m" at time k, $\alpha_k(m'')$, and the forward state probability for state m'" at time k, $\alpha_k(m''')$, are all assumed known. In addition, the branch metrics for the t branches originating at state m' at time k and terminating at state m at time k+1, $\gamma_k^i$, $0 \leq i \leq t-1$; the branch metrics for the u branches originating at state m" at time k and terminating at state m at time k+1, $\gamma_k^i$, $t \leq i \leq t+u-1$; and the branch metrics for the v branches originating at state m'" at time k and terminating at state m at time k+1, $\gamma_k^i$, $t+u \leq i \leq t+u+v-1$, are all assumed known.

The branches terminating at state m at time k+1 are first grouped according to the state at which the branches originate. Thus, the t branches originating at state m' are grouped together; the u branches originating at state m" are grouped together; and the v branches originating at state m'" are grouped together.

A first group value may then be computed responsive to one or more of the branch metrics in the first group, $\gamma_k^i$, $0 \leq i \leq t-1$. A second group value may be computed responsive to one or more of the branch metrics in the second group, $\gamma_k^i$, $t \leq i \leq t+u-1$. A third group value may be computed responsive to one or more of the branch metrics in the third group, $\gamma_k^i$, $t+u \leq i \leq t+u+v-1$.

In the previously discussed implementation example employing the MAX* operator, the first value group may be derived from $\text{MAX}^*(\gamma_k^i, \forall i, 0 \leq i \leq t-1)$; the second group value may be derived from $\text{MAX}^*(\gamma_k^i, \forall i, t \leq i \leq t+u-1)$; and the third group value may be derived from $\text{MAX}^*(\gamma_k^i, \forall i, t+u \leq i \leq t+u+v-1)$.

The forward state probability $\alpha_{k+1}(m)$ may then be derived from the first, second and third group values and the forward state probabilities, $\alpha_k(m')$, $\alpha_k(m'')$, and $\alpha_k(m''')$, respectively, of one or more of the predecessor states to the three groups.

In the previously discussed implementation example employing the MAX* operator, the forward state probability $\alpha_{k+1}(m)$ may be derived from $\text{MAX}^*(\beta_k(m')+\text{MAX}^*(\gamma_k^i, \forall i, 0 \leq i \leq t-1), \alpha_k(m'')+\text{MAX}^*(\gamma_k^i, \forall i, t \leq i \leq t+u-1), \alpha_k(m''')+\text{MAX}^*(\gamma_k^i, \forall i, t+u \leq i \leq t+u+v-1))$.

The estimates or extrinsic outputs in this implementation may be computed one bit at a time. For a particular bit, the branches for a particular portion of the trellis may first be grouped according to the origination and termination states, and whether the branch implies release at the corresponding bit position of a logical "0" or logical "1". A group value may then be computed for each of the groups based on the branch metrics for the branches in the group. The estimates or extrinsic output for the bit may then be determined responsive to the group values, the forward state probabilities for the predecessor states of the groups, the backward state probabilities for the successor states of the groups, and, possibly, the a priori probability for the bit.

In one implementation example, the group value for a group may be derived from the MAX* of the branch metrics for all the branches in the group. For each group, the forward state probability of the origination state for the group and the backward state probability for the termination state for the group may both be added to the group value to form a second group value for the group. A soft estimate for the bit may then be derived from the difference between the MAX* of the second group values for all those groups which imply a release of logical 1, and the MAX* of the second group values for all those groups which imply a release of logical 0. An extrinsic output for the bit may then be derived by subtracting the a priori probability for the bit from the soft estimate of the bit. This process may then be repeated for each of the k bits.

Figure 8C:
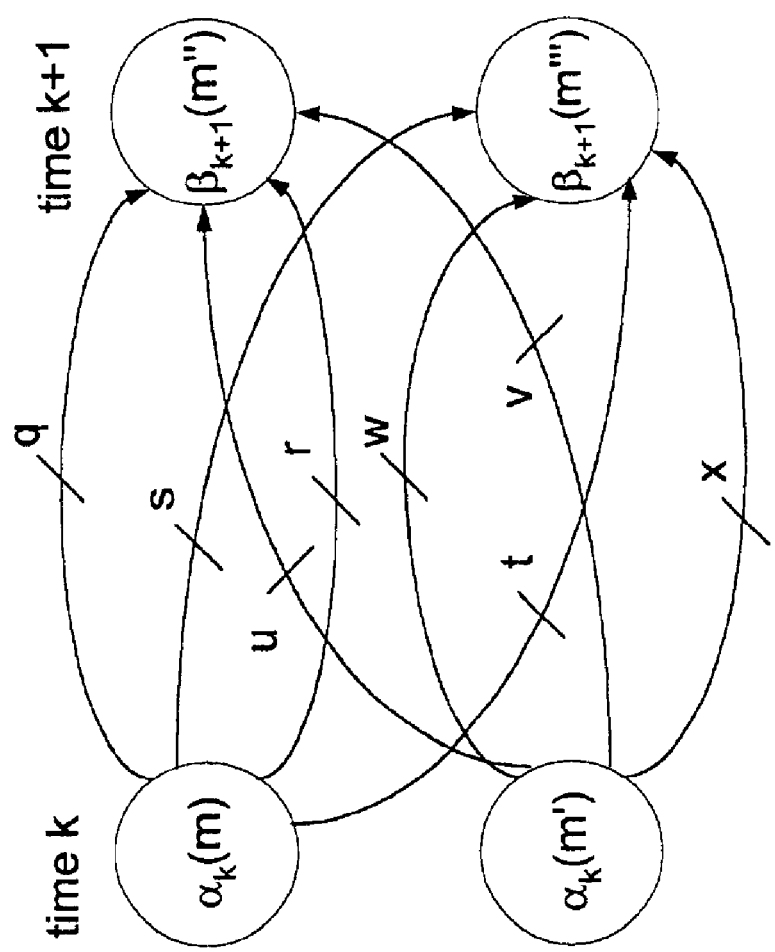
FIG. 8C is a portion of a trellis illustrating the computation of extrinsic outputs according to one embodiment of the invention.

The foregoing processes may be illustrated in the context of an example, illustrated in FIG. 8C, in which the extrinsic output of one of k bits is to be determined. The forward state probability for state m at time k, $\alpha_k(k)$, the forward state probability for state m' at time k, $\alpha_k(m')$, the backward state probability for state m" at time k+1, $\beta_{k+1}(m")$, and the backward state probability for state m'" at time k+1, $\beta_{k+1}(m'")$, are all assumed known.

Moreover, it is assumed that there are q branches from state m at time k to state m" at time k+1 which imply a release of a logical "0"; that r branches from state m at time k to state m" at time k+1 imply a release of a logical "1"; that s branches from state m at time k to state m'" at time k+1 imply release of a logical "0", that t branches from state m at time k to state m'" at time k+1 imply release of a logical "1"; that u branches from state m' at time k to state m" at time k+1 imply release of a logical "0"; that v branches from state m' at time k to state m" at time k+1 imply release of a logical "1"; that w branches from state m' at time k to state m'" at time k+1 imply release of a logical "0"; and that x branches from state m' at time k to state m'" at time k+1 imply release of a logical "1".

It is further assumed that the branch metrics for the q branches from state m at time k to state m" at time k+1 which imply a release of a logical "0", $\gamma_k^i$, $0 \leq i \leq q-1$, are known; that the branch metrics for the r branches from state m at time k to state m" at time k+1 which imply a release of a logical "1", $\gamma_k^i$, $0 \leq i \leq r-1$, are known; that the branch metrics for the s branches from state m at time k to state m'" at time k+1 which imply release of a logical "0", $\gamma_k^i$, $0 \leq i \leq s-1$, are known; that the branch metrics for the t branches from state m at time k to state m'" at time k+1 which imply release of a logical "1", $\gamma_k^i$, $0 \leq i \leq t-1$, are known; that the branch metrics for the u branches from state m' at time k to state m" at time k+1 which imply release of a logical "0", $\gamma_k^i$, $0 \leq i \leq u-1$, are known; that the branch metrics for the v branches from state m' at time k to state m" at time k+1 which imply release of a logical "1", $\gamma_k^i$, $0 \leq i \leq v-1$, are known; that the branch metrics for the w branches from state m' at time k to state m'" at time k+1 which imply release of a logical "0", $\gamma_k^i$, $0 \leq i \leq w-1$, are known; and that the branch metrics for the x branches from state m' at time k to state m'" at time k+1 which imply release of a logical "1", $\gamma_k^i$, $0 \leq i \leq x-1$, are known.

The branches may be grouped in groups according to the origination and termination states, and whether the branch implies release of a logical "1" or "0". In the example illustrated, the branches are grouped into eight groups, with the first group comprising the q branches from state m at time k to state m" at time k+1 which implies release of a logical "0"; with the second group comprising the r branches from state m at time k to state m" at time k+1 which implies release of a logical "1"; with the third group comprising the s branches from state m at time k to state m'" at time k+1 which implies release of a logical "0"; with the fourth group comprising the t branches from state m at time k to state m'" at time k+1 which implies release of a logical "1"; with the fifth group comprising the u branches from state m' at time k to state m" at time k+1 which implies release of a logical "0"; with the sixth group comprising the v branches from state m' at time k to state m" at time k+1 which implies release of a logical "1"; with the seventh group comprising the w branches from state m' at time k to state m'" at time k+1 which implies release of a logical "0"; and with the eighth group comprising the x branches from state m' at time k to state m'" at time k+1 which implies release of a logical "1".

A first group value may then be computed responsive to one or more of the branch metrics in the first group, $\gamma_k^i$, $0 \leq i \leq q-1$. A second group value may be computed responsive to one or more of the branch metrics in the second group, $\gamma_k^i$, $q \leq i \leq q+r-1$. A third group value may be computed responsive to one or more of the branch metrics in the third group, $\gamma_k^i$, $q+r \leq i \leq q+r+s-1$. A fourth group value may then be computed responsive to one or more of the branch metrics in the first group, $\gamma_k^i$, $q+r+s \leq i \leq q+r+s+t-1$. A fifth group value may be computed responsive to one or more of the branch metrics in the second group, $\gamma_k^i$, $q+r+s+t \leq i \leq q+r+s+t+u-1$. A sixth group value may be computed responsive to one or more of the branch metrics in the third group, $\gamma_k^i$, $q+r+s+t+u \leq i \leq q+r+s+t+u+v-1$. A seventh group value may then be computed responsive to one or more of the branch metrics in the first group, $\gamma_k^i$, $q+r+s+t+u+v \leq i \leq q+r+s+t+u+v+w-1$. An eighth group value may be computed responsive to one or more of the branch metrics in the eighth group, $\gamma_k^i$, $q+r+s+t+u+v+w \leq i \leq q+r+s+t+u+v+w+x-1$.

In one implementation example employing the MAX* operator, the first group value may be derived from MAX* ($\gamma_k^i$, $\forall i$, $0 \leq i \leq q-1$); the second group value may be derived from MAX*($\gamma_k^i$, $\forall i$, $q \leq i \leq q+r-1$); the third group value may be derived from MAX*($\gamma_k^i$, $\forall i$, $q+r \leq i \leq q+r+s-1$); the fourth value group may be derived from MAX*($\gamma_k^i$, $\forall i$, $q+r+s \leq i \leq q+r+s+t-1$); the fifth group value may be derived from MAX*($\gamma_k^i$, $\forall i$, $q+r+s+t \leq i \leq q+r+s+t+u-1$); the sixth group value may be derived from MAX*($\gamma_{kak}^i$, $\forall i$, $q+r+s+t+u \leq i \leq q+r+s+t+u+v-1$); the seventh group may be derived from MAX*($\gamma_k^i$, $\forall i$, $q+r+s+t+u+v \leq i \leq q+r+s+t+u+v+w-1$); and the eighth group value may be derived from MAX*($\gamma_k^i$, $\forall i$, $q+r+s+t+u+v+w \leq i \leq q+r+s+t+u+v+w+x-1$).

The estimate or extrinsic output may then be derived from these eight group values and the forward state probabilities of the states from which the groups originate, $\alpha_k(m')$ and $\alpha_k(m')$, the backward state probabilities of the states at which the groups terminate, $\beta_{k+1}(m")$ and $\beta_{k+1}(m'")$, and, possibly, the a priori probability $\lambda_i$ for the bit in question.

In the previously discussed implementation example employing the MAX* operator, the extrinsic output for a bit, $BIT_i$, may be derived from MAX*[$\alpha_k(m)$+MAX*($\gamma_k^1$, $\forall i$, $0 \leq i \leq q-1$)+$\beta_{k+1}(m")-\lambda_i$, $\alpha_k(m)$+MAX*($\gamma_k^i$, $\forall i$, $q+r \leq i \leq q+r+s-1$)+$\beta_{k+1}(m'")-\lambda_i$, $\alpha_k(m')$+MAX*($\gamma_k^i$, $\forall i$, $q+r+s+t \leq i \leq q+r+s+t+u-1$)+$\beta_{k+1}(m")-\lambda_i$, $\alpha_k(m")$+MAX*($\gamma_k^i$, $\forall i$, $q+r+s+t+u+v \leq i \leq q+r+s+t+u+v+w-1$)+$\beta_{k+1}(m'")-\lambda_i$]−MAX*[$\alpha_k(m)$+MAX*($\gamma_k^i$, $\forall i$, $q \leq i \leq q+r-1$)+$\beta_{k+1}(m")-\lambda_i$, $\alpha_k(m)$+MAX*($\gamma_k^i$, $\forall i$, $q+r+s \leq i \leq q+r+s+t-1$)+$\beta_{k+1}(m'")-\lambda_i$, $\alpha_k(m')$+MAX*($\gamma_k^i$, $\forall i$, $q+r+s+t+u \leq i \leq q+r+s+t+u+v-1$)+$\beta_{k+1}(m")-\lambda_i$, $\alpha_k(m')$+MAX*($\gamma_k^i$, $\forall i$, $q+r+s+t+u+v+w \leq i \leq q+r+s+t+u+v+w+x-1$)+$\beta_{k+1}(m'")-\lambda_i$]. (Alternatively, a soft estimate of the bit my be derived from the same mathematical expression with the terms "$-\lambda_i$" eliminated). The foregoing process may then be repeated for each of the k extrinsic outputs which is involved.

Figure 7B:
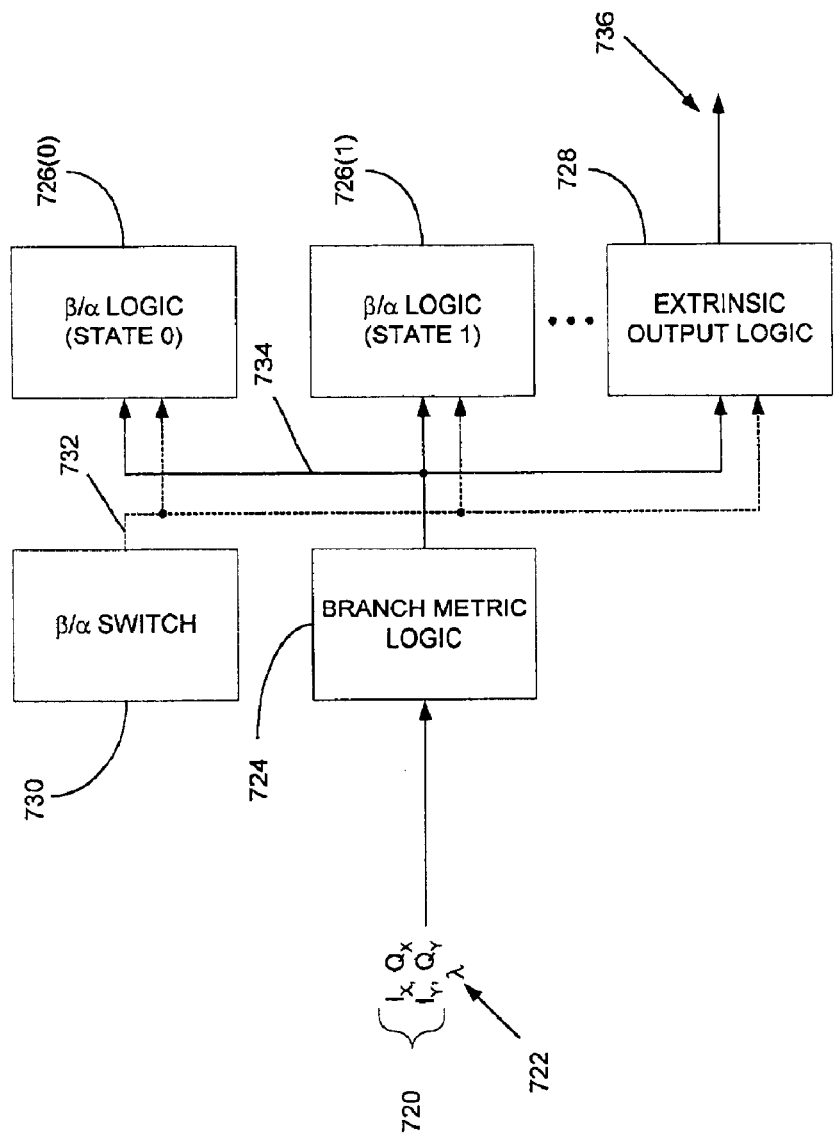
FIG. 7B is a block diagram of a second embodiment of a system for decoding TCM symbols according to the invention.

A second embodiment of a system according to the invention is illustrated in block diagram form in FIG. 7B. Four dimensional quadrature symbols, identified in the figure with numeral 720 and represented as $I_X$ $Q_X$, $I_Y$, and $Q_Y$, are input to branch metric logic 724. The symbols may comprises two 8-PSK symbols as produced from a TCM encoder comprising the series combination of a rate 5/6 convolutional encoder and a bit to symbol mapper for mapping each 6 bit output of the convolutional encoder into 2 8-PSK symbols. Such an encoder is an example of the encoder illustrated in FIG. 4 and previously described.

A priori probabilities for the 5 bits which gave rise to the two 8-PSK symbols, identified in the figure with numeral 722 and represented as λ, are also input to the branch metric logic 724.

Figure 8D:
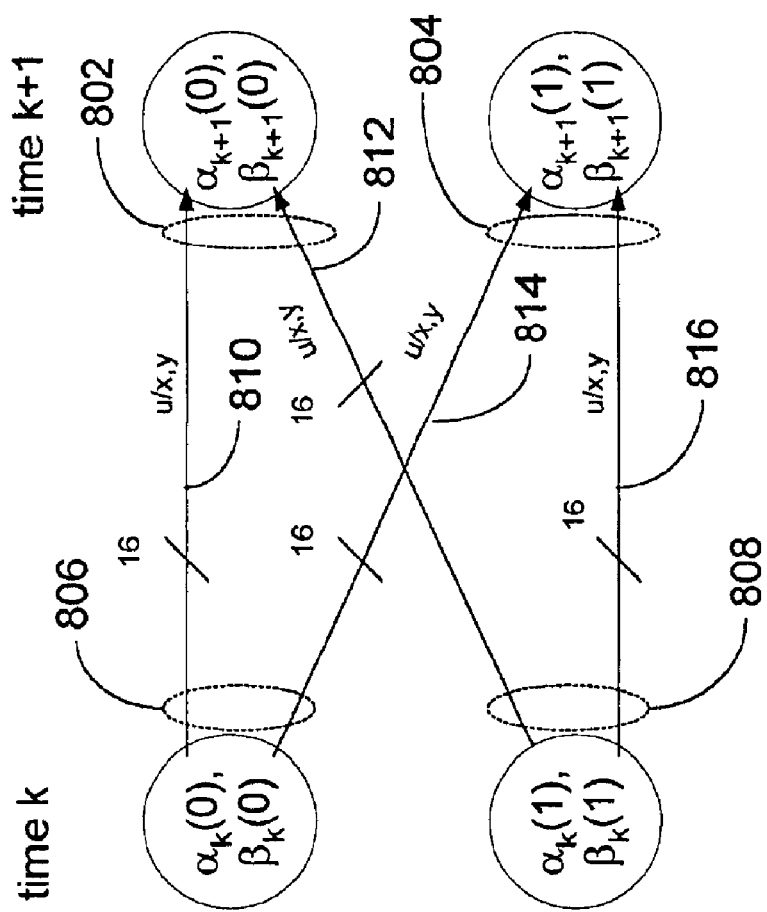
FIG. 8D is a portion of a trellis illustrating the computation of forward and backward state probabilities according to a second embodiment of the invention.

The branch metric logic 724 is configured to produce, in parallel, branch metrics for each of the branches in the portion of the trellis corresponding to the inputs 720 and 722. To further explain the operation of the branch metric logic 724, consider that the corresponding portion of the trellis may be represented as illustrated in FIG. 8D. At each instant of time, there are only two states in the trellis, state 0 and state 1, reflecting the fact that the constraint length of the corresponding encoder is two (one plus the number of shift registers), and the number of states in the trellis is given by two raised to the power of the constraint length minus one.

Each branch represents a transition of the encoder from one of the states at time k to one of the states at time k+1 and therefore corresponds to a particular combination of the 5 input bits, represented in the figure with u, and the resulting two 8-PSK symbols, represented in the figure with x, y.

A total of 32 branches originate at state 0 at time k, representing the 32 possible combinations of the 5 input bits, and 32 branches originate at state 1 at time k, also representing the 32 possible combinations of the 5 input bits. Of the 32 branches originating at state 0 at time k, 16 terminate at state 0 at time k+1 and 16 terminate at state 1 at time k+1. Of the 32 branches originating at state 1 at time k, 16 terminate at state 0 at time k+1, and 16 terminate at state 1 at time k+1.

Turning back to FIG. 7B, the branch metric logic 724 computes in parallel the 64 branch metrics for the 64 branches illustrated in FIG. 8D. Generally speking, the branch metric for a branch represents (1) a measure of the correlation between the 5 bits corresponding to the branch, which may be represented as u, with the 5 a priori probabilities input to the branch metric logic 724, which may be represented as λ; and (2) a measure of the correlation between the 2 8-PSK symbols corresponding to the branch, which may be represented as x and y, with the 2 8-PSK symbols input to the branch metric logic, which may be represented as $I_X$, $Q_X$, $I_Y$, and $Q_Y$.

β/α switch 730 indicates whether the system is functioning as a backward engine (β mode) or whether it is functioning as a forward engine (α mode).

The branch metrics produced by branch metric logic 724 are provided to β/α logic (state 0) 726(0), β/α logic (state 1) 726(1), and extrinsic output logic 728 over one or more signal lines 734. In addition, the indication of whether the system is functioning in β or α mode is provided to β/α logic (state 0) 726(0), β/α logic (state 1) 726(1), and extrinsic output logic 728 over one or more signal lines 732.

Responsive to these inputs, β/α logic (state 0) 726(0) is configured to update the backward or forward state probabilities of state 0 and β/α logic (state 1) 726(1) is configured to update the backward or forward state probabilities of state 1. Both logic 726(0) and logic 726(1) are configured to operate in parallel.

If β mode is called for, β/α logic (state 0) 726(0) computes the backward state probability for state 0 at time k, $β_k(0)$, responsive to the backward probabilities for states 0 and 1 at time k+1, $β_{k+1}(1)$ and $β_{k+1}(1)$, respectively, and selected ones of the 64 branch metrics between the two states, which may be represented as $γ_k^i$, $0 \leq i \leq 63$, where $γ_k^i$, $0 \leq i \leq 15$, represent the branch metrics for the 16 branches between state 0 at time k and state 0 at time k+1; $γ_k^1$, $16 \leq i \leq 31$, represent the branch metrics for the 16 branches between state 1 at time k and state 0 at time k+1; $γ_k^i$, $32 \leq i \leq 47$, represent the branch metrics for the 16 branches between state 0 at time k and state 1 at time k+1; and $γ_k^i$, $48 \leq i \leq 63$, represent the branch metrics for the 16 branches between state 1 at time k and state 1 at time k+1.

Similarly, if β mode is called for, β/α logic (state 1) 726(1) computes the backward state probability for state 1 at time k, $β_k(1)$, responsive to the backward probabilities for states 0 and 1 at time k+1, $β_{k+1}(0)$ and $β_{k+1}(1)$, respectively, and selected ones of the 64 branch metrics between the two states, $γ_{khu\ i}$, $0 \leq i \leq 63$.

These processes occur by first grouping the branches into 4 groups of 16 branches each according to their origination and termination states. The first group represents the 16 branches between state 0 at time k and state 0 at time k+1; the second group represents the 16 branches between state 1 at time k and state 0 at time k+1; the third group represents the 16 branches between state 0 at time k and state 1 at time k+1; and the fourth group represents the 16 branches between state 1 at time k and state 1 at time k+1.

Then, a group value is formed for each of the 4 groups equal to the MAX* of the branch metrics for the 16 branches in the group. Thus, the first group value is set to MAX*($γ_k^i$, $\forall i, 0 \leq i \leq 15$); the second group value is set to MAX*($γ_k^i$, $\forall i, 16 \leq i \leq 31$); the third group value is set to MAX*($γ_k^i$, $\forall i, 32 \leq i \leq 47$); and the fourth group value is set to MAX*($γ_k^i$, $\forall i, 48 \leq i \leq 63$).

Next, the backward state probability for the terminating state of a group at time k+1 is added to the group value for the group. The backward state probability for state 0 at time k, $β_k(0)$, is then derived from the MAX* of the resulting values for the first and third groups, MAX*[($β_{k+1}(0)$+MAX*($γ_k^i$, $\forall i, 0 \leq i \leq 15$)), ($β_{k+}1(1)$+MAX*($γ_k^i$, $\forall i, 32 \leq i \leq 47$))]. The backward state probability for state 1 at time k, $β_k(1)$, is then derived from the MAX* of the resulting values for the second and fourth groups, MAX*[($β_{+1}(0)$+MAX*($γ_k^i$, $\forall i, 16 \leq i \leq 31$)), ($β_{k+1}(1)$+MAX*($γ_k^i$, $\forall i, 48 \leq i \leq 63$))].

If α mode is called for, β/α logic (state 0) 726(0) computes the forward state probability for state 0 at time k+1, $α_{k+1}(0)$, responsive to the forward probabilities for states 0 and 1 at time $α_k(0)$ and $α_k(1)$, respectively, and selected ones of the 64 branch metrics for the branches between the states at times k and k+1. Again, these branch metrics may be represented as $β_k^i$, $0 \leq i \leq 63$, where $γ_k^i$, $0 \leq i \leq 15$, represent the branch metrics for the 16 branches between state 0 at time k and state 0 at time k+1; $γ_k^i$, $16 \leq i \leq 31$, represent the branch metrics for the 16 branches between state 1 at time k and state 0 at time k+1; $γ_k^i$, $32 \leq i \leq 47$, represent the branch metrics for the 16 branches between state 0 at time k and state 1 at time k+1; and $γ_k^i$, $48 \leq i \leq 63$, represent the branch metrics for the 16 branches between state 1 at time k and state 1 at time k+1.

Similarly, if α mode is called for, β/α logic (state 1) 726(1) computes the forward state probability for state 1 at time k+1, $α_{k+1}(1)$, responsive to the forward probabilities for states 0 and 1 at time k, $α_k(0)$ and $α_k(1)$, respectively, and selected ones of the 64 branch metrics, $γ_k^i$, $0 \leq i \leq 63$.

These processes occur by first grouping the branches into 4 groups of 16 branches each according to their origination and termination states. Again, the first group represents the 16 branches between state 0 at time k and state 0 at time k+1; the second group represents the 16 branches between state 1 at time k and state 0 at time k+1; the third group represents the 16 branches between state 0 at time k and state 1 at time k+1; and the fourth group represents the 16 branches between state 1 at time k and state 1 at time k+1.

Then, a group value is formed for each of the 4 groups equal to the MAX* of the branch metrics for the 16 branches in the group. Thus, the first group value is set to MAX*($\gamma_k^i$, $\forall i, 0 \leq i \leq 15$); the second group value is set to MAX*($\gamma_k^i$, $\forall i$, $16 \leq i \leq 31$); the third group value is set to MAX*($\gamma_k^i$, $\forall i$, $32 \leq i \leq 47$); and the fourth group value is set to MAX*($\gamma_k^i$, $\forall i, 48 \leq i \leq 63$).

Next, the forward state probability for the originating state of a group at time k is added to the group value for the group. The forward state probability for state 0 at time k+1, $\alpha_{k+1}(0)$, is then derived from the MAX* of the resulting values for the first and second groups, MAX*[($\alpha_k(0)$+MAX*($\gamma_k^i$, $\forall i, 0 \leq i \leq 15$)), ($\alpha_k(1)$+MAX*($\gamma_k^i$, $\forall i$, $16 \leq i \leq 32$))]. The forward state probability for state 1 at time k+1, $\alpha_{k+1}(1)$, is then derived from the MAX* of the resulting values for the third and fourth groups, MAX*[($\alpha_k(0)$+MAX*($\gamma_k^i$, $\forall i, 32 \leq i \leq 47$)), ($\alpha_k(1)$+MAX*($\gamma_k^i$, $\forall i$, $48 \leq i \leq 63$))].

Extrinsic output logic 728 determines extrinsic outputs for each of the underlying 5 input bits. In one embodiment, extrinsic output logic 728 is only enabled if the α mode is called for, i.e., if the system is functioning as a forward engine. In this embodiment, one or more backward engines compute backward state probabilities for a portion of a trellis, and then one or more forward engines compute forward state probabilities and concurrently generate extrinsic outputs in parallel with the calculation of forward state probabilities. However, it should be appreciated that other embodiments are possible, including embodiments where extrinsic outputs are generated by one or more forward engines in parallel with the calculation of backward state probabilities.

With reference to FIG. 8D, extrinsic output logic 728 is able to produce extrinsic outputs only after the forward state probabilities for time k have been produced, the backward state probabilities for time k+1 have been produced, and the 64 branch metrics for the branches between the states in the two time periods have been produced.

Figure 8E:
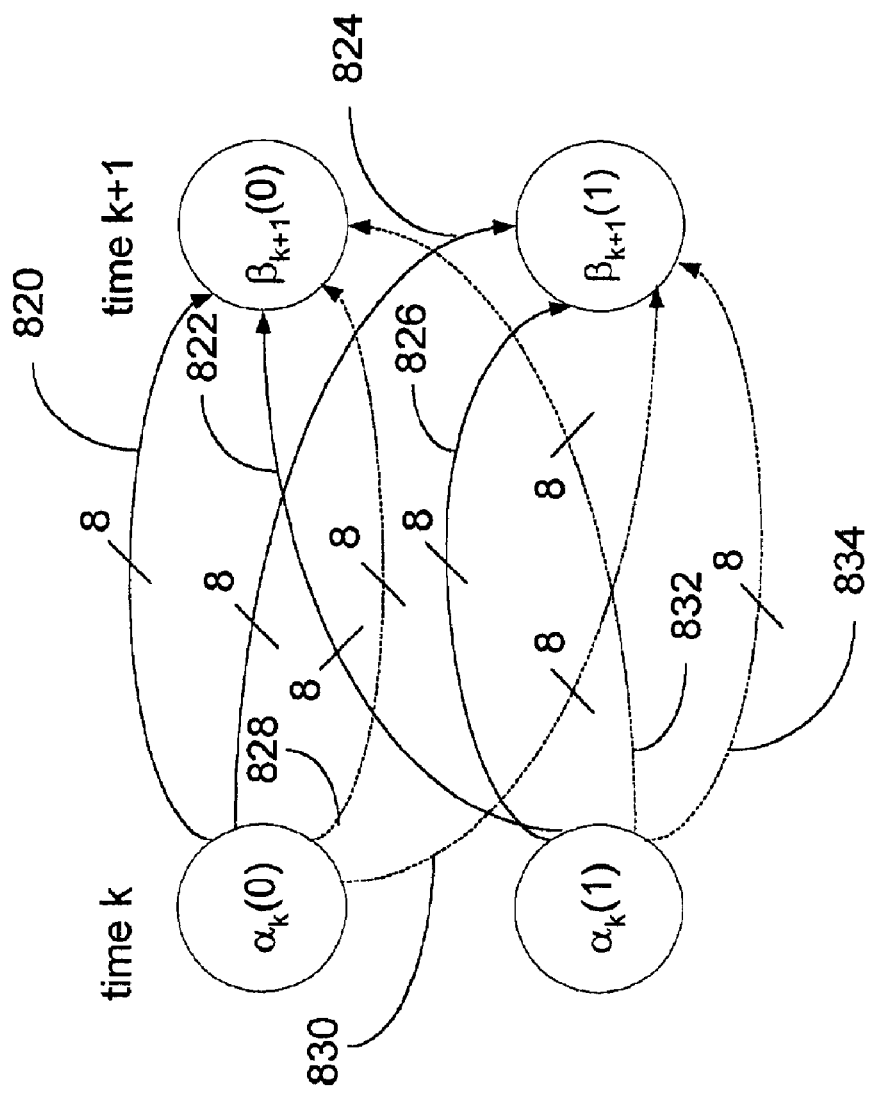
FIG. 8E is a portion of a trellis illustrating the computation of extrinsic outputs according to a second embodiment of the invention.

This process occurs through 5 iterations, one for each of the 5 underlying input bits. In a particular iteration, the process begins by dividing the 64 branches into 8 groups, according to the originating and terminating states, and whether the branch implies release of a logical "1" or "0" for the underlying source bit. These 8 groups may be depicted as shown in FIG. 8E. In this figure, a solid line represents a branch which implies release of a logical "1" and a dashed branch implies release of a logical "0". The first group comprises the 8 solid branches from state 0 at time k to state 0 at time k+1; the second group comprises the 8 dashed branches from state 0 at time k to state 0 at time k+1; the third group comprises the 8 solid branches from state 1 at time k to state 0 at time k+1; the fourth group comprises the 8 dashed branches from state 1 at time k to state 0 at time k+1; the fifth group comprises the 8 solid branches from state 0 at time k to state 1 at time k+1; the sixth group comprises the 8 dashed branches from state 0 at time k to state 1 at time k+1; the seventh group comprises the 8 solid branches from state 1 at time k to state 1 at time k+1; and the eighth group comprises the 8 dashed branches from state 1 at time k to state 1 at time k+1.

Group values may then derived for each group from the MAX* of the branch metrics for the branches in the group. Assume that the branch metrics for the first group may be represented as $\gamma_k^i$, $0 \leq i \leq 7$; those for the second group as $\gamma_k^i$, $8 \leq i \leq 15$; those for the third group as $\gamma_k^i$, $16 \leq i \leq 23$; those for the fourth group as $\gamma_k^i$, $24 \leq i \leq 31$; those for the fifth group as $\gamma_k^i$, $32 \leq i \leq 39$; those for the sixth group as $\gamma_k^i$, $40 \leq i \leq 47$; those for the seventh group as $\gamma_k^i$, $48 \leq i \leq 55$; and those for the eighth group as $\gamma_k^i$, $56 \leq i \leq 63$.

Thus, the first group value may be set to MAX*($\gamma_k^i$, $\forall i$, $0 \leq i \leq 7$); the second group value may be set to MAX*($\gamma_k^i$, $\forall i, 8 \leq i \leq 15$); the third group value may be set to MAX*($\gamma_k^i$, $\forall i, 16 \leq i \leq 23$); the fourth group value may be set to MAX* ($\gamma_k^i$, $\forall i, 24 \leq i \leq 31$); the fifth group value may be set to MAX*($\gamma_k^i$, $\forall i, 32 \leq i \leq 39$); the sixth group value may be set to MAX*($\gamma_k^i$, $\forall i, 40 \leq i \leq 47$); the seventh group value may be set to MAX*($\gamma_k^1$, $\forall i, 48 \leq i \leq 55$); and the eighth group value may be set to MAX*($\gamma_k^i$, $\forall i, 56 \leq i \leq 63$).

For each group, the forward state probability of the originating state, and the backward state probability for the terminating state, may be added to the group value for the group. The MAX* of all resulting values from groups which imply release of a logical "1" is then formed. Mathematically, this value may be represented as MAX* [($\alpha_k(0)$+MAX*($\gamma_k^i$, $\forall i, 0 \leq i \leq 7$)+$\beta_{k+1}(0)$), ($\alpha_k(0)$+MAX* ($\gamma_k^i$, $\forall i, 16 \leq i \leq 23$)+$\beta_{k+1}(1)$), ($\alpha_k(1)$+MAX*($\gamma_k^i$, $\forall i$, $32 \leq i \leq 39$)+$\beta_{k+1}(1)$), ($\alpha_k(1)$+MAX*($\beta_k^i$, $\forall i, 48 \leq i \leq 55$)+ $\beta_{k+1}(1)$)]. Similarly, the MAX* of all resulting values which imply release of a logical "0" is also formed. Mathematically, this value may be represented as MAX*[($\alpha_k(0)$+MAX*($\gamma_k^i$, $\forall i, 8 \leq i \leq 15$)+$\beta_{k+1}(0)$), ($\alpha_k(0)$+MAX*($\gamma_k^i$, $\forall i, 24 \leq i \leq 31$)+ $\beta_{k+1}(1)$), ($\alpha_k(1)$+MAX*($\gamma_k^i$, $\forall i, 40 \leq i \leq 47$)+$\beta_{k+1}(0)$), ($\alpha_k(1)$+MAX*($\gamma_k^i$, $\forall i, 56 \leq i \leq 63$)+$\beta_{k+1}(1)$)]. The difference between these two values, MAX*[($\alpha_k(0)$ +MAX*($\gamma_k^i$, $\forall i$, $0 \leq i \leq 7$)+$\beta_{k+1}(0)$), ($\alpha_k(0)$+MAX*($\gamma_k^i$, $\forall i, 16 \leq i \leq 23$)+$\beta_{k+1}(1)$), ($\alpha_k(1)$+MAX*($\gamma_k^i$, $\forall i, 32 \leq i \leq 39$)+$\beta_{k+1}(0)$), ($\alpha_k(1)$+ MAX*($\beta_k^i$, $\forall i$, $48 \leq i \leq 55$)+$\beta_{k+1}(1)$)]−MAX*[($\alpha_k(0)$+ MAX*($\gamma_k^i$, $\forall i, 8 \leq i \leq 15$)+$\beta_{k+1}(0)$), ($\alpha_k(0)$+MAX*($\gamma_k^i$, $\forall i$, $24 \leq i \leq 31$)+$\beta_{k+1}(1)$), ($\alpha_k(1)$+MAX*($\gamma_k^i$, $\forall i, 40 \leq i \leq 47$)+ $\beta_{k+1}(0)$), ($\alpha_k(1)$+MAX*($\gamma_k^i$, $\forall i, 56 \leq i \leq 63$)+$\beta_{k+1}(1)$)], is a log-likelihood ratio which forms a soft estimate of the bit in question. The extrinsic output for the bit may then be formed by subtracting the a priori probability for the bit, $\lambda_i$, from this value. This process is then repeated for each of the 4 other bits.

Figure 9:
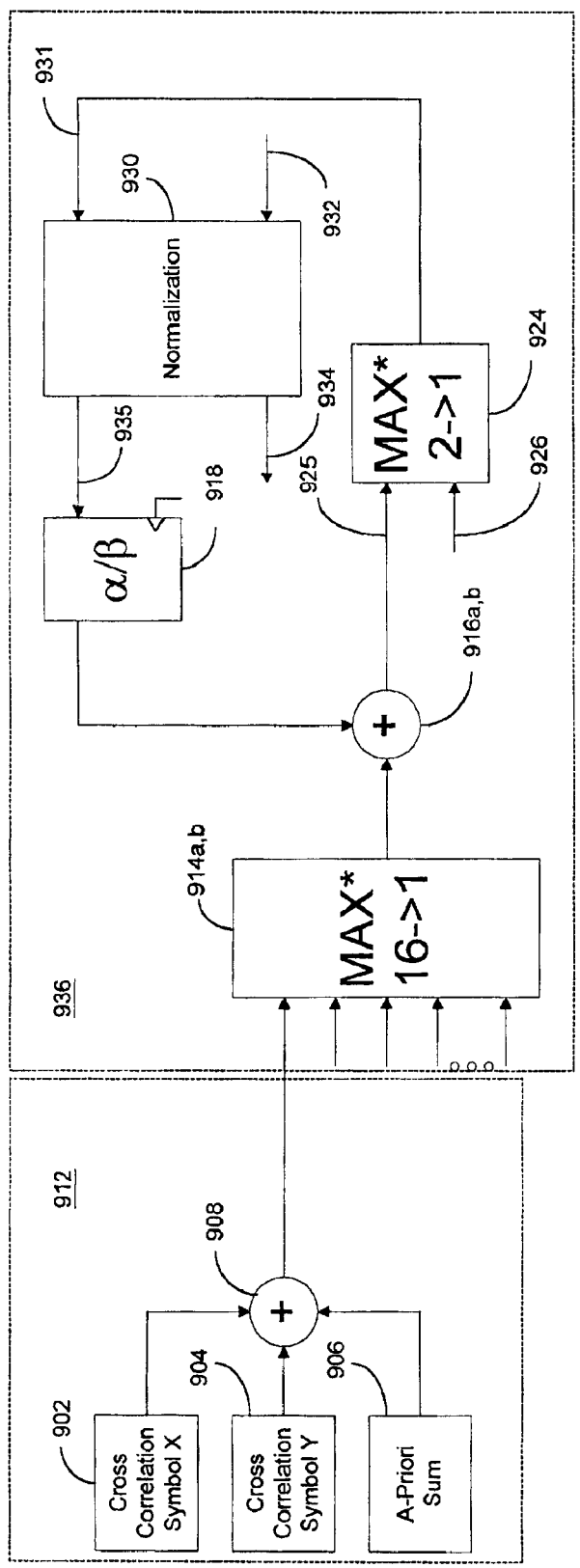
FIG. 9 is a block diagram illustrating one implementation of branch metric logic and state probability logic according to the invention.
Figure 10:
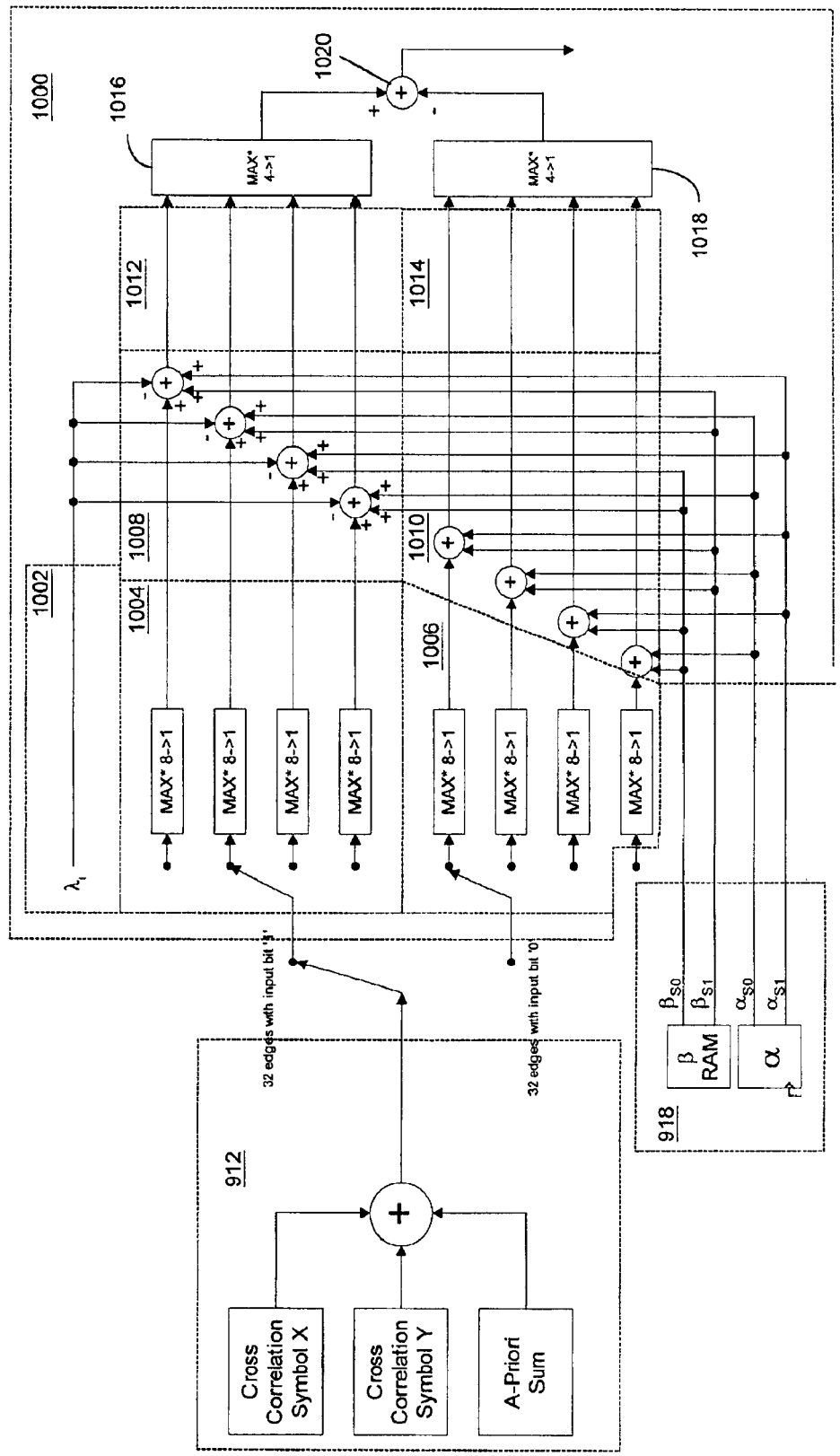
FIG. 10 is a block diagram illustrating one implementation of branch metric logic and extrinsic output logic according to the invention.

An implementation of the embodiment of FIG. 7B will now be described. This implementation is a system, which may be configured as a forward engine or a backward engine, which comprises two core modules, one for state 0 and the other for state 1, and an extrinsic output logic module. The two core modules function and are configured similarly to one another, and therefore need not be shown separately. FIG. 9 illustrates the core module, and FIG. 10 illustrates the extrinsic output logic module.

The core module receives as inputs two 8-PSK symbols, typically after transmission over a wireless or wireline communication channel, X and Y, and a priori probabilities λ for the 5 underlying source bits, and determines a state probability for the state corresponding to the module. Referring to FIG. 9, the core module comprises branch metric logic 912 and state probability logic 936.

Branch metric logic 912 comprises cross correlation symbol X logic 902 for computing, for each of the 32 branches originating or terminating at the state associated with the module, the correlation between the input 8-PSK symbol X and the 8-PSK symbol X associated with the branch in question (both of which may be represented in quadrature form as $I_X$ and $Q_X$); cross correlation symbol Y logic 904 for computing the correlation between the input 8-PSK symbol Y and the 8-PSK symbol Y associated with the branch in question (both of which may be represented in quadrature form as $I_Y$ and $Q_Y$); and A Priori Sum logic 906 for computing the correlation between the input a priori probabilities λ for the 5 underlying source bits, and the 5 source bits associated with the branch in question. Adder 908 is also provided for adding the three correlation values to form a branch metric for the branch in question.

For a forward engine, branch metric logic 912 determines the 32 branch metrics which correspond to the 32 branches which terminate at the state associated with the logic 936. For a backward engine, branch metric logic 912 determines the 32 branch metrics which correspond to the 32 branches which originate at the state associated with the logic 936. Thus, referring to FIG. 8D, if the logic 936 is associated with state 0 and is part of a forward engine, the 32 branches are those identified with numeral 802. Similarly, if the logic 936 is associated with state 1 and is part of a forward engine, the 32 branches are those identified with numeral 804. Conversely, if the logic 936 is associated with state 0 and is part of a backward engine, the 32 branches are those identified with numeral 806. Similarly, if the logic 936 is associated with state 1 and is part of a backward engine, the 32 branches are those identified with numeral 808.

Referring back to FIG. 9, the 32 branch metrics from branch metric logic 912 form two groups of 16 each, with the grouping depending on whether the core module is functioning as part of a forward or backward engine and whether the logic 936 within the module is associated with state 0 or state 1. Referring to FIG. 8D, for a core module functioning as a forward engine, and where logic 936 is associated with state 0, the two groups are those identified with numerals 810 and 812. For a core module functioning as a forward engine, and where logic 936 is associated with state 1, the two groups are those identified with numerals 814 and 816. For a core module functioning as a backward engine, and where logic 936 is associated with state 0, the two groups are those identified with numerals 810 and 814. For a core module functioning as a backward engine, and where logic 936 is associated with state 1, the two groups are those identified with numerals 812 and 816.

Referring to FIG. 9, the two groupings of 16 branch metrics are each input to separate renderings of MAX* 16->1 logic 914a, 914b which determine in parallel the MAX* of all the branches in a group. For each grouping, adders 916a, 916b add to the MAX* value for the group a previously determined state probability. For a forward engine, the state probability is an $\alpha$ value for the originating state for the group, and for a backward engine, the state probability is an $\beta$ value for the terminating state for the group. These state probabilities for the two groups, whether $\alpha$ or $\beta$, are stored in storage device 918, which may be shared with the core module for the other state, and which may be implemented as volatile memory, such as RAM, or a storage register.

Referring to FIG. 8D, if the state probability logic 936 is functioning as part of a forward engine, and is seeking to compute $\alpha_{k+1}(0)$, for the group identified with numeral 810, the previously determined state probability will be the value $\alpha_k(0)$, and for the group identified with numeral 812, the previously determined state probability will be the value $\alpha_k(1)$. If the state probability logic 936 is functioning as part of a forward engine, and is seeking to compute $\alpha_{k+1}(1)$, for the group identified with numeral 814, the previously determined state probability will be the value $\alpha_k(0)$, and for the group identified with numeral 816, the previously determined state probability will be the value $\alpha_k(1)$.

If the state probability logic 936 is functioning as part of a backward engine, and is seeking to compute $\beta_k(0)$, for the group identified with numeral 810, the previously determined state probability will be the value $\beta_{k+1}(0)$, and for the group identified with numeral 814, the previously determined state probability will be the value $\beta_{k+1}(1)$. If the state update logic 936 is functioning as part of a backward engine, and is seeking to compute $\beta_k(1)$, for the group identified with numeral 806, the previously determined state probability will be the value $\beta_{k+1}(0)$, and for the group identified with numeral 808, the previously determined state probability will be the value $\beta_{k+1}(1)$.

The outputs of adders 916a, 916b are then input to MAX* 2->1 logic 924. (One of these outputs is coupled to input 925 of logic 924; the other is coupled to input 926 of logic 924).

MAX* 2->1 logic 924 computes the MAX* of its two inputs, and this value is then input to normalization logic 930 on signal line 931, which normalizes this value in relation to the corresponding value (output of logic 928) from the core module for the other state in the trellis. This other value is provided to input 932 of normalization logic 932. In particular, the output of logic 928 in this other module is coupled to input 932 of normalization logic 930, which may be shared between the two core modules. In response, normalization logic 930 normalizes the two values relative to one another. It outputs the normalized value of the input 931 on signal line 935, and outputs the normalized value of the input 932 on signal line 934. The normalized value on signal line 935 is stored in storage logic 918. The other normalized value on signal line 934 may also be stored within the storage logic 918 assuming it is shared between the two modules. For implementations in which separate storage logic is maintained in the core modules for the two states, the other normalized value on signal line 934 may be stored in the storage logic 918 for the other core module.

FIG. 10 illustrates the extrinsic output logic module. As illustrated, the extrinsic output module comprises branch metric logic 912, storage logic 918, and extrinsic output computation logic 1000.

This module is configured to compute extrinsic outputs for each of the 5 underlying source bits once the state probabilities and branch metrics for the corresponding portion of the trellis have been computed.

Referring to FIG. 10, branch metric logic 912 provides the branch metrics for the 64 branches that are present between the states in successive time periods. Storage logic 918 provides the two forward state probabilities at time k, $\alpha_k(0)$ and $\alpha_k(1)$, and the two backward state probabilities at time k+1, $\beta_{k+1}(0)$ and $\beta_{k+1}(1)$. Logic 1002 provides one of the five a priori probabilities $\lambda_i$.

The 64 branch metrics are divided into eight groups, according to originating and terminating states, and whether the branch implies release of a logical "1" or "0" for the bit position in question (there are five). The four groups which imply release of a logical "1", identified in FIG. 8E with numerals 820, 822, 824, and 826, are each input to MAX* 8->1 logic 1004, which separately determines the MAX* of each group. The four groups which imply release of a logical "0", identified in FIG. 8E with numerals 828, 830, 832, and 834, are each input to MAX* 8->1 logic 1006, which separately determines the MAX* of each group.

The MAX* values for the four groups which imply release of a logical "1" are input to adder logic 1008 which separately adds to each of these values the forward state probability of the state from which the group originates at time k, $\alpha_k(0)$ and $\alpha_k(1)$, and the backward state probability of the state at which the group terminates at time k+1, $\beta_{k+1}(0)$ and $\beta_{k+1}(1)$. In addition, the shifted value of the a priori probability $\lambda_i$ is subtracted from each of these values, so that the outputs of the module will truly be extrinsic outputs.

Similarly, the MAX* values for the four groups which imply release of a logical "0" are input to adder logic 1010 which separately adds to each of these values the forward state probability of the state from which the group originates at time k, $\alpha_k(0)$ and $\alpha_k(1)$, and the backward state probability of the state at which the group terminates at time k+1, $\beta_{k+1}(0)$ and $\beta_{k+1}(1)$. In addition, the shifted value of the a priori probability $\lambda_i$ is subtracted from each of these values, so that the outputs of the module will truly be extrinsic outputs.

The resulting four values from adder logic 1008 are input to MAX* 4->1 logic 1016, which determines the MAX* of these four values. Similarly, the resulting four values from adder logic 1006 are input to MAX* 4->1 logic 1018, which determines the MAX* of these four values.

Adder 1020 subtracts the MAX* value of the groups which imply release of a logical "0" (output from MAX* 4->1 logic 1018) from the MAX* value of the groups which imply release of a logical "1" (output from MAX* 4->1 logic 1016). The result is an extrinsic output of the bit in question.

Figure 11B:
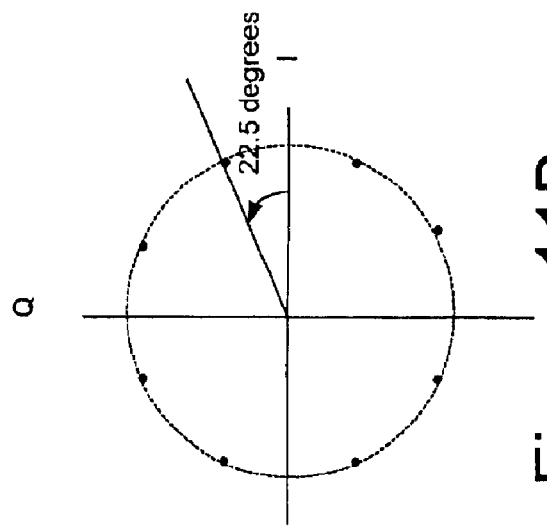
FIG. 11B illustrates an 8-PSK symbol constellation on the I-Q plane rotated counter-clockwise by $\pi/8$ radians (22.5°).
Figure 11A:
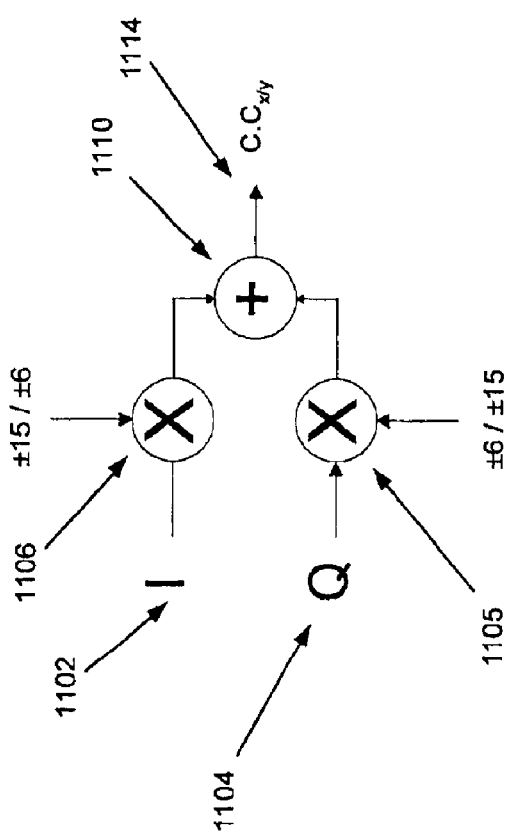
FIG. 11A is a block diagram illustrating one implementation of symbol correlation logic according to the invention.

FIG. 11A illustrates an implementation of cross correlation symbol X logic 902 (as well as cross correlation symbol Y logic 904 since the two are configured identically). This implementation takes account of the fact that each symbol in an 8-PSK symbol constellation rotated counter-clockwise by $\pi/8$ radians (22.5°) (illustrated in FIG. 11B) can be represented in quadrature form as either ($\pm\cos(\pi/8)$, $\pm\sin(\pi/8)$) or ($\pm\sin(\pi/8)$, $\pm\cos(\pi/8)$). Since $\cos(\pi/8) \approx 15/16$, and $\sin(\pi/8) \approx 6/16$, the representations may further by simplified as ($\pm 15/16$, $\pm 6/16$) or ($\pm 6/16$, $\pm 15/16$). Ignoring the divisor of 16 which is common to all the values, the representations can even further be simplified as ($\pm 15$, $\pm 6$) or ($\pm 6$, $\pm 15$).

In this implementation, multiplier 1106 multiplies the I component of the input symbol, identified with numeral 1102, by the appropriate value, $\pm 15/\pm 6$, which represents the I component of the 8-PSK symbol which corresponds to the branch in question, and multiplier 1108 multiplies the Q components of the input symbol, identified with numeral 1104, by the appropriate value, $\pm 6/\pm 15$, which represents the Q component of the 8-PSK symbol which corresponds to the branch in question.

Adder 1110 adds the outputs of the two multipliers. The resulting value, identified with numeral 1114, represents the cross-correlation between the input symbol and the symbol associated with the branch in question. For additional information on this implementation of cross correlation symbol X logic 902 (and cross correlation symbol Y logic 904), please refer to U.S. patent application Ser. No. 09/815,149, filed Mar. 22, 2001, which is hereby fully incorporated by reference herein as though set forth in full.

Figure 12:
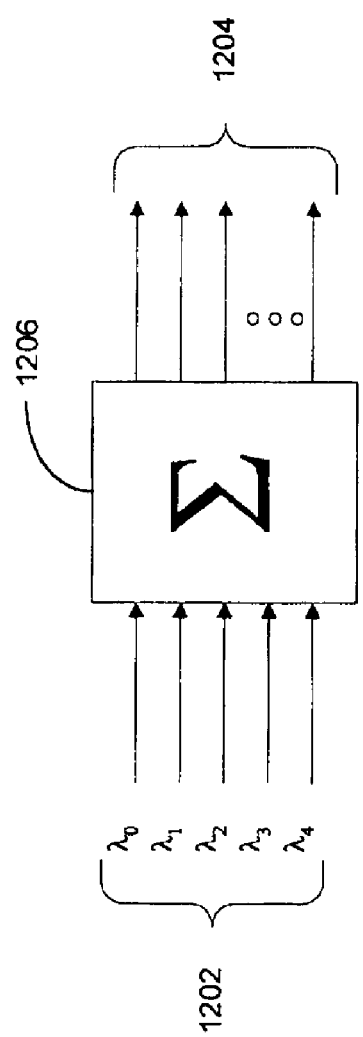
FIG. 12 is a block diagram illustrating one implementation of bit correlation logic according to the invention.

An implementation of a priori sum logic 906 is illustrated in FIG. 12. Referring to FIG. 12, the inputs to the logic, identified with numeral 1202, comprise the five a prior probabilities for the underlying source bits, $\lambda_i$, i=0, . . . , 4. These inputs are input to summing logic 1206, which produces outputs, identified with numeral 1204, consisting of all possible correlations between these a priori probabilities and the 32 possible combinations of the 5 underlying source bits. Since these underlying source bits may be either 0 or 1, the 32 possible outputs may be represented as $$\sum_{i=0}^{4} w_i \cdot \lambda_i,$$

where $w_i$ may be either 0 or 1. This set of outputs consists of the values 0, each of the $\lambda_i$, and each possible sum of any two or more of the $\lambda_i$.

Figure 13:
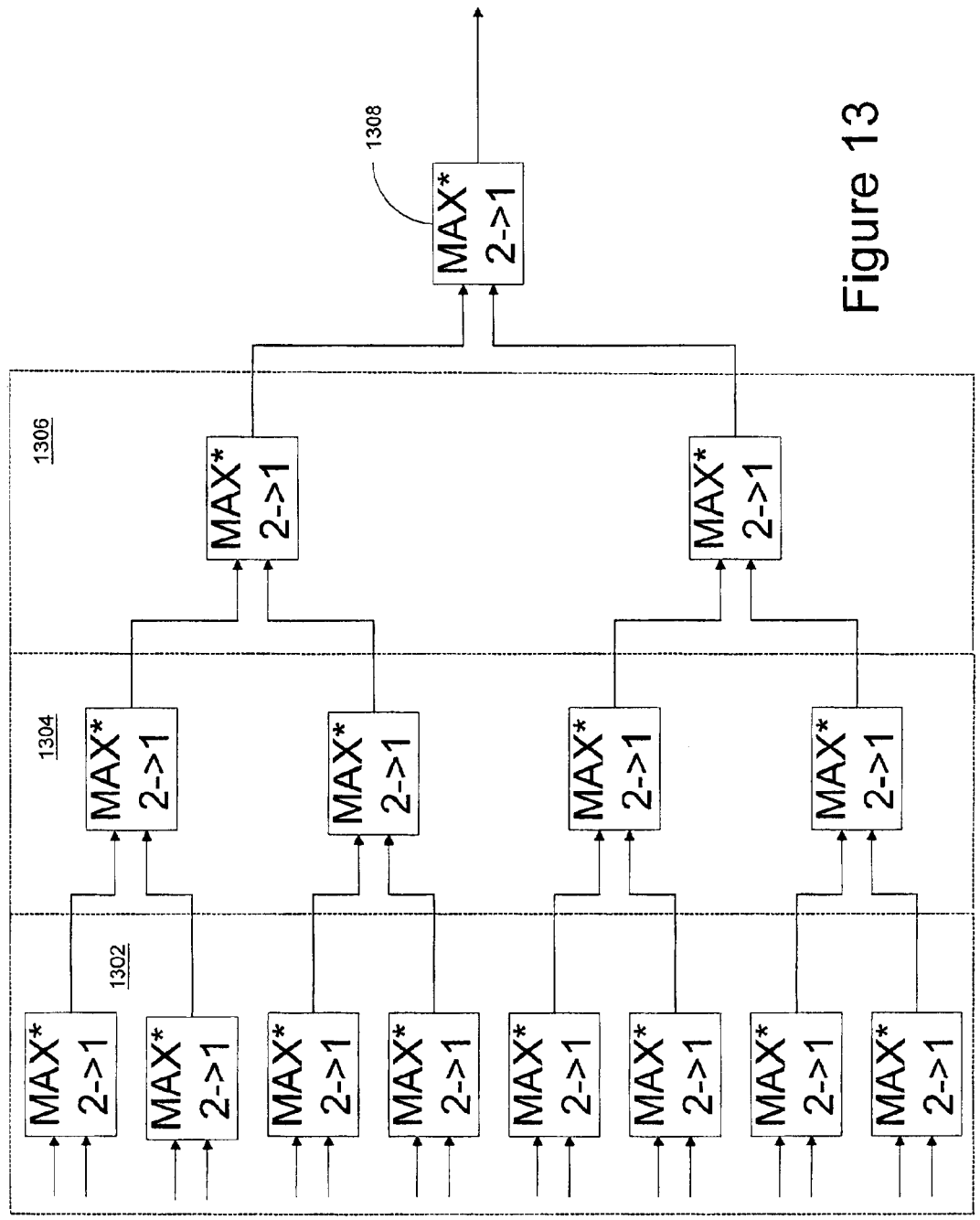
FIG. 13 is a block diagram illustrating one implementation of 16 to 1 MAX* computation logic according to the invention.

FIG. 13 illustrates an implementation of MAX* 16->1 logic 914a, 914b appearing as part of state probability logic 936 illustrated in FIG. 9. As illustrated, because of the associative property of the MAX* function, this logic may be implemented as a hierarchical tree of multiple renderings of MAX* 2->1 logic, with the first level 1302 consisting of 8 separate renderings of the MAX* 2->1 logic; with the second level 1304 consisting of 4 separate renderings of the MAX* 2->1 logic; with the third level 1306 consisting of 2 separate renderings of the MAX* 2->1 logic; and with the fourth level 1308 consisting of a single rendering of the MAX* 2->1 logic.

Figure 14:
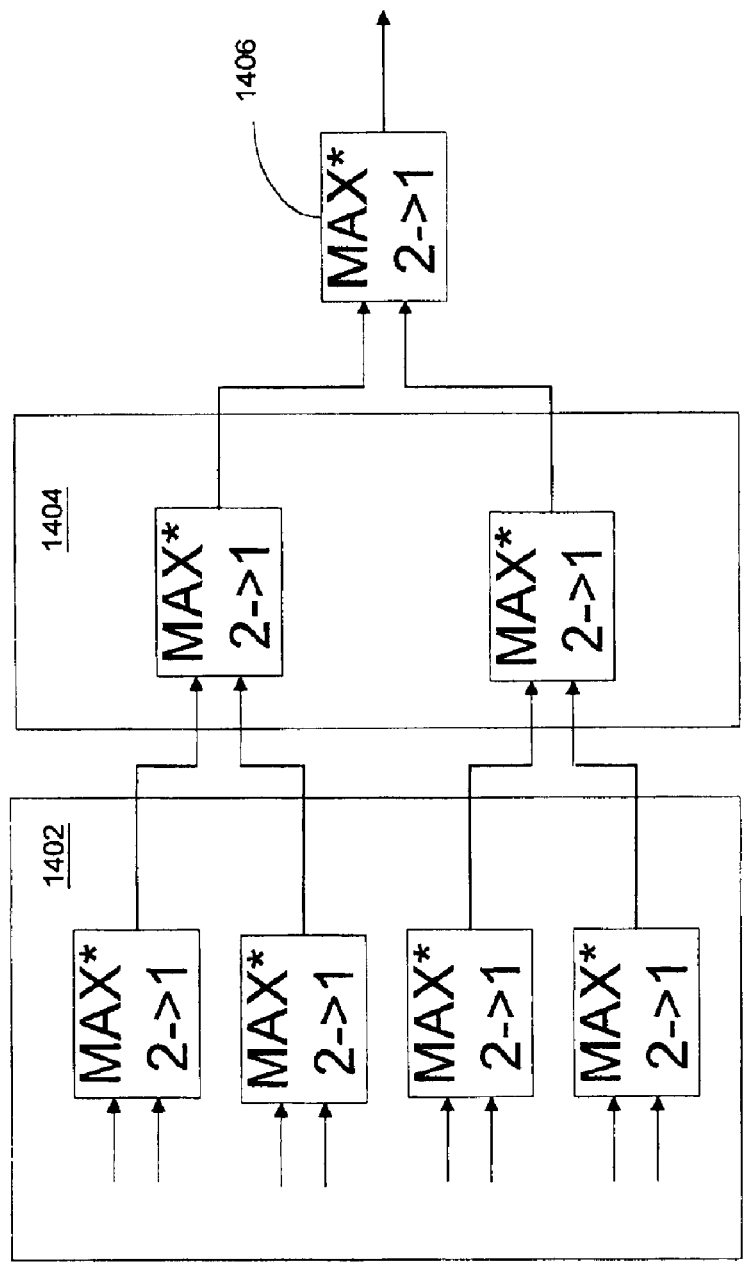
FIG. 14 is a block diagram illustrating one implementation of 8 to 1 MAX* computation logic according to the invention.

FIG. 14 illustrates an implementation of MAX* 8->1 logic appearing in blocks 1004, 1006 as part of the extrinsic output logic illustrated in FIG. 10. As illustrated, this logic may be implemented as a hierarchical tree of multiple renderings of MAX* 2->1 logic, with the first level 1402 consisting of 4 separate renderings of the MAX* 2->1 logic; with the second level 1404 consisting of 2 separate renderings of the MAX* 2->1 logic, and with the third level consisting of a single rendering of the MAX* 2->1 logic.

Figure 15:
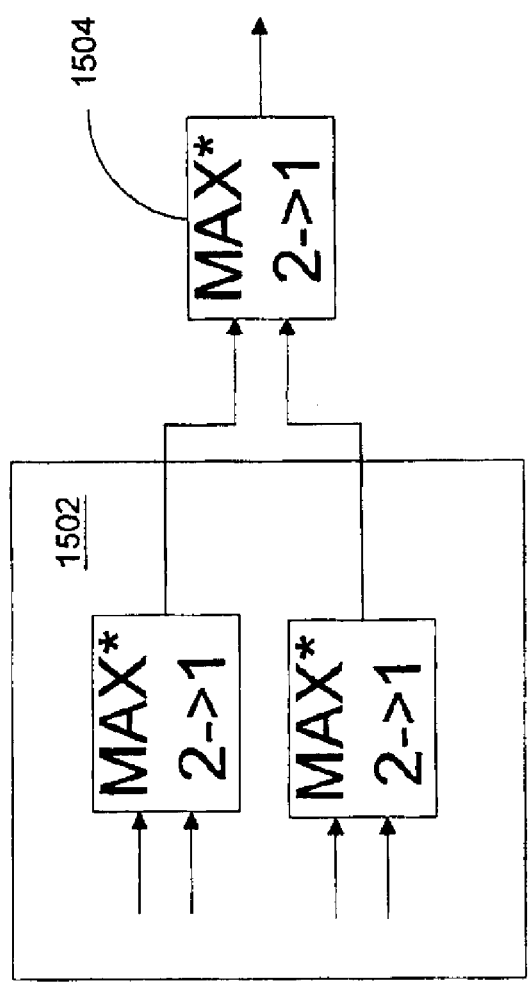
FIG. 15 is a block diagram illustrating one implementation of 4 to 1 MAX* computation logic according to the invention.

FIG. 15 illustrates an implementation of MAX* 4->1 logic appearing as blocks 1016, 1018 within the extrinsic output logic illustrated in FIG. 10. As illustrated, this logic may be implemented as a hierarchical tree of multiple renderings of MAX* 2->1 logic, with the first level consisting of 2 separate renderings of the MAX* 2->1 logic; and with the second level consisting of a single rendering of the MAX* 2->1 logic.

Figures 16A, 16B:
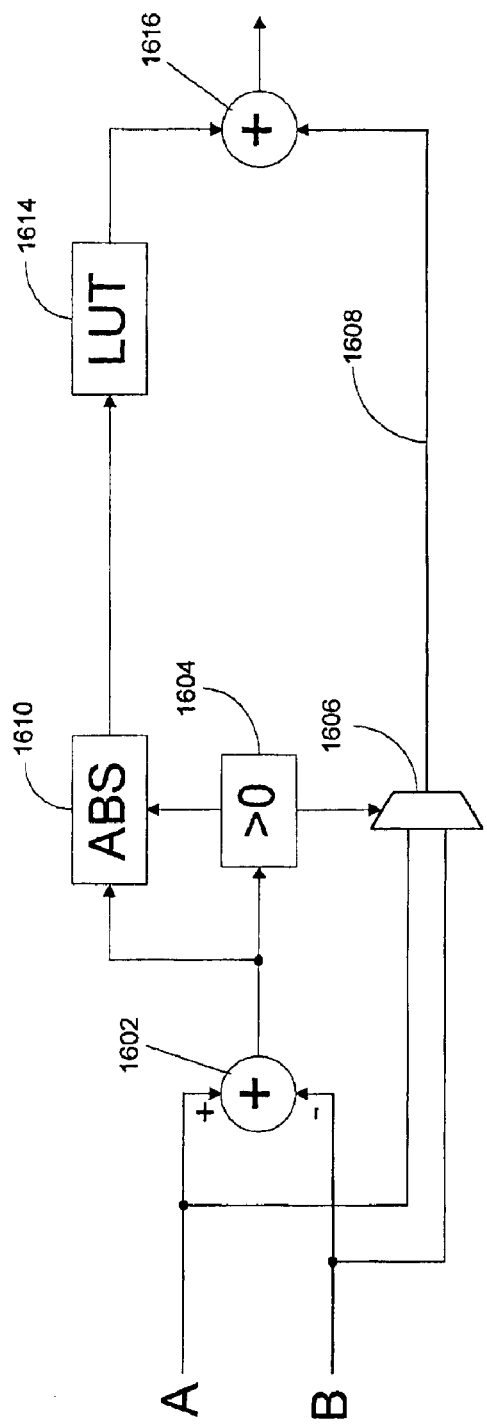
FIG. 16A is a block diagram illustrating one implementation of 2 to 1 MAX* computation logic according to the invention.
FIG. 16B illustrates a lookup table employed in the implementation of the MAX* 2->1 computation logic illustrated in FIG. 16A.

FIG. 16A illustrates an implementation of the MAX* 2->1 logic which appears directly as block 924 in FIG. 9, and which, as described above, forms the basis for the MAX* 16->1, MAX* 8->1, and MAX* 4->1 logic appearing in FIGS. 9 and 10.

As illustrated, logic 1602 receives the two operands, A and B, forms the difference, A–B, between the two, and outputs a signal representative of this difference value. Logic 1604 receives the signal representing this difference value, tests whether it is greater than zero, and then outputs a signal indicative of the results of this test. Logic 1606 receives this signal, and the two operands A and B, and outputs the operand A if the signal from logic 1604 indicates that the difference value A–B is greater than zero; if this signal indicates that the difference value A–B is less than or equal to zero, it outputs the operand B. Thus, it can be seen that the output of logic 1606 is a signal representative of the maximum of A and B, or MAX(A, B).

Logic 1610 receives from logic 1602 the signal representative of the difference value A–B, and from logic 1604 the signal indicative of whether the difference value A–B is greater than zero, and outputs a signal representative of the value A–B if the signal from logic 1604 indicates that the difference value A–B is greater than zero; if the signal from logic 1604 indicates that the difference value A–B is less than or equal to zero, logic 1610 outputs a signal representative of the value –(A–B). Thus, it can be seen that the output of logic 1610 is a signal representative of the absolute value of A–B or ABS(A–B).

Logic 1614 receives the signal from logic 1610 (which is representative of ABS(A–B)) and accesses a lookup table (LUT) using the value ABS(A–B) as the argument. The LUT, which is illustrated in FIG. 16B, associates a value corresponding to $\ln(1+\exp(-|A-B|))$ with the value ABS(A–B) for representative ones of the value ABS(A–B). Thus, it can be seen that logic 1614 retrieves a value corresponding to $\ln(1+\exp(-|A-B|))$ based on the argument ABS(A–B). Logic 1614 outputs a signal representative of or corresponding to the value $\ln(1+\exp(-|A-B|))$.

Logic 1616 receives the signals output from logic 1614 and logic 1606, and adds the two to form a signal representative of the value MAX(A, B)+ln(1+exp(-|A-B|)). Referring to equation (1) above, it can be seen that this value is the MAX* of the operands A and B.

Figure 17:
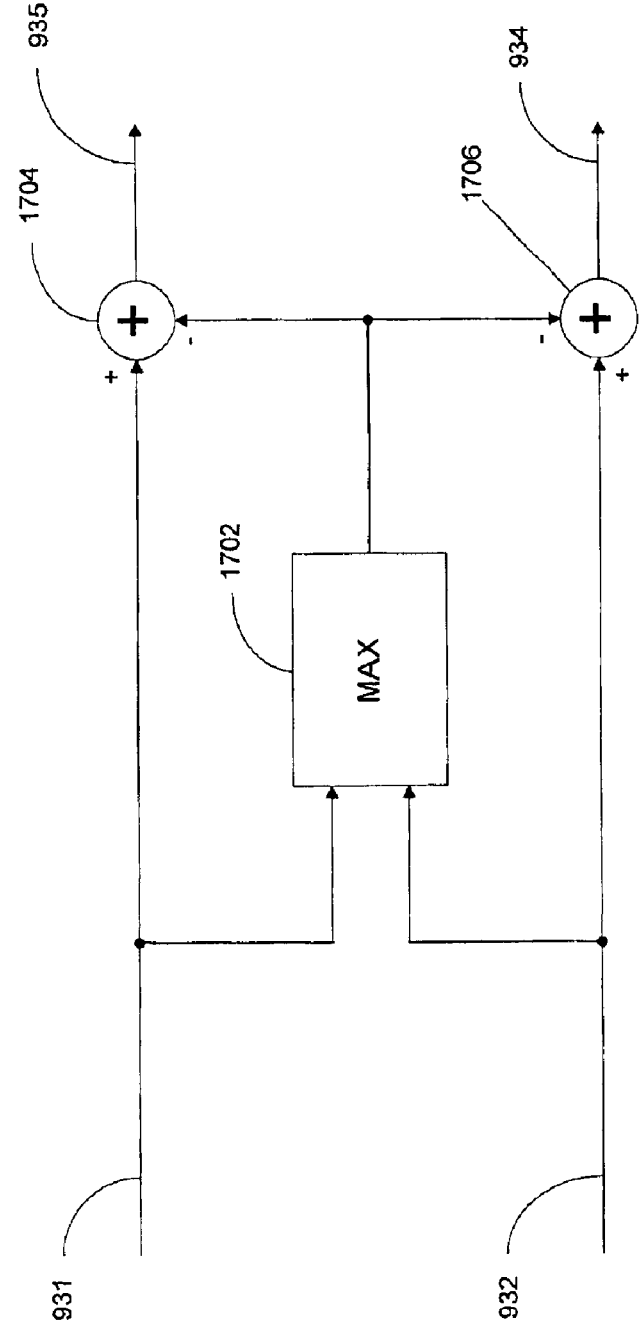
FIG. 17 is a block diagram illustrating one implementation of normalization logic according to the invention.

FIG. 17 illustrates an implementation of the normalization block 930 illustrated in FIG. 9. As illustrated, logic 1702 determines the maximum one of the two input values provided respectively on signal lines 931 and 932, and logic 1704 and logic 1706 subtract this maximum from each of the two input values. Consequently, one of the outputs of logic 1702 will be zero, and the other output will be negative. The results comprise normalized values provided respectively on signal lines 935 and 934.

For purposes of this disclosure, any of the logic referred to above can be implemented in hardware, software, or a combination of hardware and software. For example, the logic may be implemented in hardware as an asynchronous integrated circuit chip (ASIC), or a DSP or other processor configured to execute a series of instructions embodying a method according to the invention.

Figure 18:
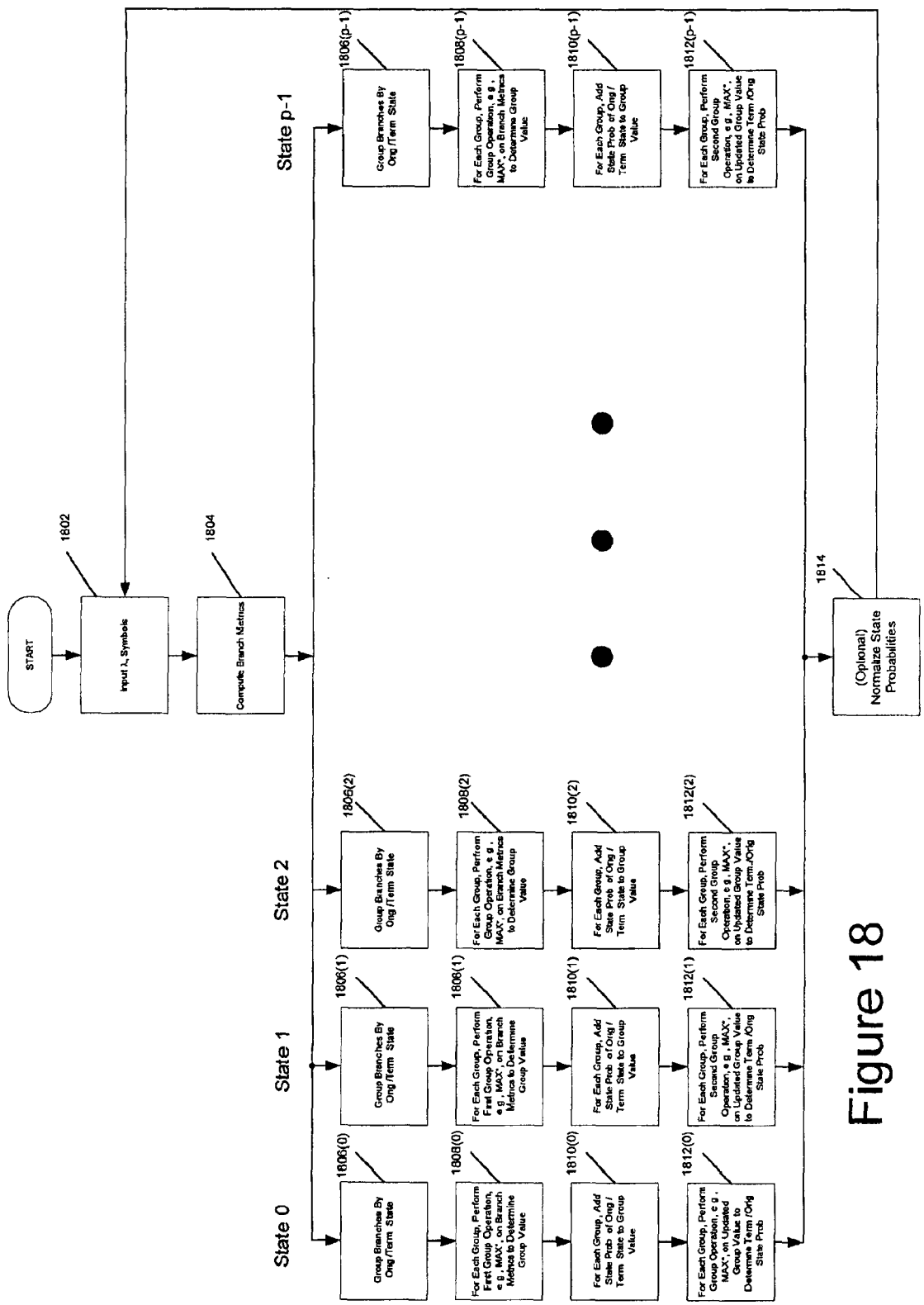
FIG. 18 is a flowchart of one embodiment of a method of determining state probabilities according to the invention.

FIG. 18 is a flowchart of one embodiment of a method for determining state probabilities according to the invention. As illustrated, the method begins with step 1802, where k a priori probabilities $\lambda_i$, $1 \leq i \leq k$, and m symbols $s_i$, $1 \leq i \leq k$, are input. Step 1802 is followed by state 1804, where branch metrics are computed for the branches in a portion of a trellis responsive to the a priori probabilities and symbols input in the previous step. In one implementation, the branch metric for a branch is computed by determining the correlation between the k a priori probabilities with the k bits associated with the branch, determining the correlation between each of the m symbols and the corresponding symbol associated with the branch, and then adding all these correlation values together to arrive at the branch metric for the branch.

After step 1804, the method branches into p different branches, where p is the number of states in the trellis, which are all performed in parallel. The same steps are performed in each branch, so only the branch at the far left for state 0 need be explained in detail, it being understand that this description applies to each of the other branches.

The first step within the branch for state 0 is step 1806(0), in which the branches terminating or originating at the state are divided into groups. If forward state probabilities are being computed, this step involves dividing the branches terminating at the state into groups according to originating state; if backward state probabilities are being computed, this step involves dividing the branches originating at the step into groups according to terminating state.

Step 1806(0) is followed by step 1808(0), in which a group operation is performed on each of the groups to determine a group value for each group. In one implementation, the group operation is the MAX* operation performed on the branch metrics of the branches in a group, and the group value for the group is the MAX* of these group values.

Step 1806(0) is followed by step 1808(0), in which the group values for the groups are updated responsive to the values of previously determined state probabilities. If forward state probabilities are being computed, the forward state probability of the originating state for the group is added to the group value for the group; if backward state probabilities are being computed, the backward state probability of the terminating state for the group is added to the group value for the group.

Step 1810(0) is followed by step 1812(0), in which a group operation is performed on all the updated group values to determine a state probability for the state. In one implementation, the group operation is the MAX* operation.

After step 1812(0), the method waits if necessary until all the p branches are completed. At that point, optional step 1814 is performed, in which the p state probabilities are normalized relative to one another. After optional step 1814, the method may branch back to step 1802 for another iteration.

Figure 19:
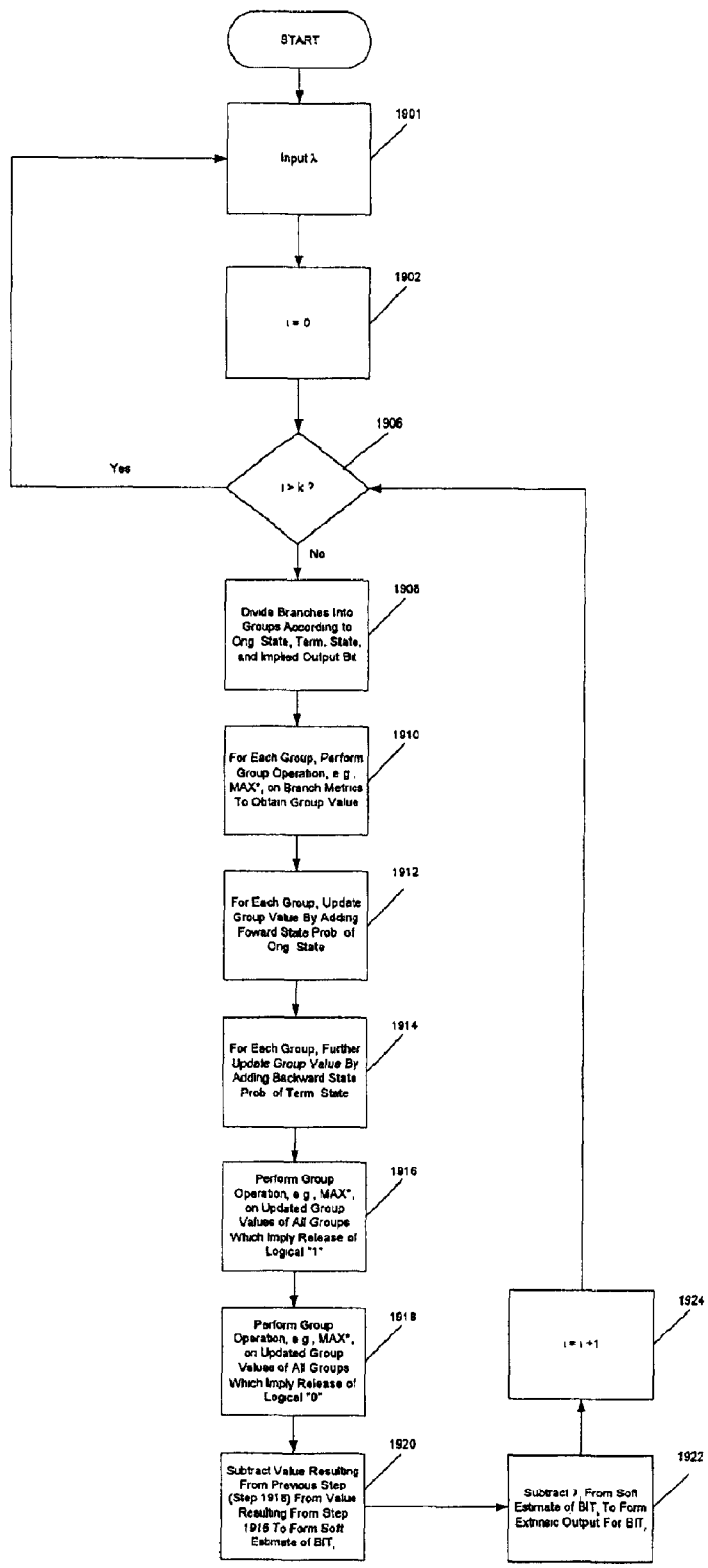
FIG. 19 is a flowchart of one embodiment of a method of determining extrinsic outputs according to the invention.

FIG. 19 is a flowchart illustrating one embodiment of a method for determining extrinsic outputs according to the invention. As illustrated, the method begins with step 1901, in which k a priori probabilities $\lambda$ are input. Step 1901 is followed by step 1902, in which an index i is initialized to zero. Step 1906 follows step 1902. In step 1906 the index i is tested to determine if it exceeds k, the total number of input bits which correspond to a branch. If so, the method jumps back to step 1901 for another iteration of the method with a new set of k a priori probabilities; if not, the method proceeds to step 1908.

In step 1908, the branches in the corresponding portion of the trellis are divided into groups according to originating and terminating states, and whether the branch implies release of a logical "1" or "0" for the input bit in the ith position ($BIT_i$).

In Step 1908 is followed by step 1910, in which a group operation is performed, and a group value obtained, for each of the groups. In one implementation, the group operation is the MAX* operation performed on the branch metrics for the branches in a group, and the group value is the MAX* of these branch metrics.

Step 1910 is followed by step 1912, in which the group values are updated by adding to each group value the forward state probability of the originating state for the group.

Step 1912 is followed by step 1914, in which the group values are further updated by adding to the group value the backward state probability of the terminating state for the group.

Step 1914 is followed by step 1916, in which a group operation is performed on all the group values for groups which imply release of a logical "1" for $BIT_i$. In one implementation, this group operation is the MAX* operation.

Step 1918 follows step 1916. In step 1918, a group operation is performed on all the group values for groups which imply release of a logical "0". In one implementation, this group operation is the MAX* operation.

Step 1918 is followed by step 1920. In step 1920, the value from step 1918 is subtracted from the value from step 1916 to determine a soft estimate of $BIT_i$.

Step 1922 follows step 1920. In step 1922, the a priori probability $\lambda_i$ is subtracted from the soft estimate computed in step 1920 to determine an extrinsic output for $BIT_i$.

In lieu of step 1922, the a priori probability $\lambda_i$ for $BIT_i$ may be subtracted from the group value for each group as part of steps 1912 or 1914.

Step 1924 follows step 1922. In step 1924, the index i is incremented. A jump is then made to step 1906 for another iteration of the method for another bit.

Each of the foregoing methods may be tangibly embodied on a processor readable medium including without limitation RAM, ROM, PROM, EPROM, EEPROM, floppy disk, hard disk, CD-ROM, DVD, etc.

From the foregoing, it can be seen that there are several advantages and benefits which may be realized from the invention. One advantage which may be realized in one embodiment is a reduction in computational complexity due to the order in which group operations (such as MAX*) are performed on the branch metrics in the process of determining state probabilities. More specifically, in one embodiment of the invention, the forward state probability for a state may be computed by grouping the branches terminating at the state into groups according to the originating states of the branches, performing a first group operation (such as MAX*) on the branch metrics in each group and determining a group value (such as MAX*) for each of the groups, updating the group value for each group by adding the (previously determined) forward state probability of the originating state of the group, and then performing a second group operation (such as MAX*) on the updated group values to determine the forward state probability for the state. Similarly, the backward state probability for a state may be computed by grouping the branches originating at the state into groups according to the terminating states of the branches, performing a first group operation (such as MAX*) on the branch metrics in each group and determining a group value (such as MAX*) for each of the groups, updating the group value for each group by adding the (previously determined) backward state probability of the terminating state of the group, and then performing a second group operation (such as MAX*) on the updated group values to determine the backward state probability for the state. In this embodiment, by performing the first group operation on the branch metrics before adding in the forward state probability of the originating state (in the case forward state probabilities are being computed) or the backward state probability of the terminating state (in the case backward state probabilities are being computed), instead of deferring the first group operation until after these probabilities have been added in, the computation is simplified since a large number of additional operations can be eliminated.

A second advantage which may be realized in one embodiment is a reduction in computational complexity due to the normalization of state probabilities which is performed. More specifically, by normalizing state probabilities, the magnitude of the state probabilities is reduced. Hence, the process of recursively computing state probabilities and the process of computing extrinsic outputs using these state probabilities is simplified.

A third advantage which may be realized in one embodiment is an efficiency in the design of the MAX* 2->1 logic which occurs through the sharing of the output of the test logic, which indicates whether the value A−B is greater than zero, by the MAX logic and the ABS logic.

A fourth advantage which may be realized in one embodiment is simplicity in the design of the MAX* 16->1, MAX* 8->1, and MAX* 4->1 logic each of which are formed using the MAX* 2->1 logic as constituent building blocks.

A fifth advantage which may be realized in one embodiment is design efficiency in that a forward and backward engine may each be configured from essentially the same core module.

A sixth advantage which may be realized in one embodiment is design efficiency in that the state update modules within the core module may each be implemented from essentially the same logic.

A seventh advantage which may be realized in one embodiment is computational efficiency in that a branch metric can be computed for a branch which represents both the level of correlation between one or more symbols and one or more symbols corresponding to the branch and one or more a priori probabilities and one or more bits associated with the branch.

While various embodiments of the invention have been described, it will be apparent to those of ordinary skill in the art that many more embodiments and implementations are possible that are within the scope of this invention. For example, any combination of any of the systems or methods described in this disclosure are possible.

What is claimed is:

1. A system for determining one or more state probabilities for one or more states in a trellis representation, the system comprising:
    branch metric logic for determining one or more branch metrics for one or more branches between one or more states in a first portion of the trellis and one or more states in a second portion of the trellis; and
    state probability logic for determining one or more state probabilities for one or more of the states, comprising:
        first logic for grouping one or more of the branches into groups;
        second logic for performing, for one or more of the groups, a first group operation on one or more of the branch metrics for the branches in the group to determine a group value for the group;
        third logic for updating, for one or more of the groups, the group value for the group based on one or more previously determined state probabilities; and
        fourth logic for performing, for one or more of the states, a second group operation on one or more of the updated group values to determine a state probability for the state.

2. The system of claim 1 wherein the first group operation is MAX*.

3. The system of claim 2 wherein the group value for a group is the MAX* of one or more of the branch metrics of the branches in the group.

4. The system of claim 1 wherein the second group operation is MAX*.

5. The system of claim 4 wherein the updated group value for a group is the MAX* of one or more of the branch metrics for branches in the group added to a forward state probability for the originating state for the group, or a backward state probability for the terminating state of the group.

6. The system of claim 5 wherein the state probability for a state is determined by performing the MAX* of one or more of the updated group values for groups originating from or terminating at the state.

7. A system for determining one or more state probabilities for states in a trellis representation, the system comprising:
    branch metric computation means for determining one or more branch metrics for one or more branches between one or more states in a first portion of the trellis and one or more states in a second portion of the trellis; and
    state probability computation means for determining one or more state probabilities for one or more of the states, comprising:
        first means for grouping one or more of the branches into groups;
        second means for performing, for one or more of the groups, a first group operation on the branch metrics for one or more of the branches in the group to determine a group value for the group;
        third means for updating, for one or more of the groups, the group value for the group based on one or more previously determined state probabilities; and
        fourth means for performing, for one or more of the states, a second group operation on one or more of the updated group values to determine a state probability for the state.

8. A system for determining one or more state probabilities for one or more states in a trellis representation, the system comprising:

branch metric logic for determining one or more branch metrics for one or more branches between one or more states in a first portion of the trellis and one or more states in a second portion of the trellis; and a plurality p of state probability logic modules for determining in parallel state probabilities for each of p states in either the first or second portions of the trellis, where p is an integer of two or more, each of the p modules comprising:

first logic for grouping one or more of the branches into groups;

second logic for performing, for one or more of the groups, a first group operation on one or more of the branch metrics for branches in the group to determine a group value for the group;

third logic for updating, for one or more of the groups, the group value for the group based on one or more previously determined state probabilities; and fourth logic for performing a second group operation on one or more of the updated group values to determine a state probability for the state.

9. The system of claim 8 further comprising normalization logic for normalizing one or more of the state probabilities for the p states.

10. The system of claim 9 wherein the normalization logic is configured to determine the maximum one of the state probabilities of one or more of the p states, and to subtract this maximum from one or more of the p state probabilities.

11. A system for determining one or more state probabilities for one or more states in a trellis representation, the system comprising:

branch metric computation means for determining one or more branch metrics for one or more branches between one or more states in a first portion of the trellis and one or more states in a second portion of the trellis; and a plurality p of state probability computation means for determining in parallel state probabilities for one or more of p states, where p is an integer of two or more, each of the p computation means comprising:

first means for grouping one or more of the branches into groups;

second means for performing, for one or more of the groups, a first group operation on one or more of the branch metrics for the branches in the group to determine a group value for the group;

third means for updating, for one or more of the groups, the group value for the group based on one or more previously determined state probabilities; and fourth means for performing a second group operation on one or more of the updated group values to determine a state probability for the state.

12. The system of claim 11 further comprising normalization means for normalizing one or more of the state probabilities for the p states.

13. A system for determining an estimate of or extrinsic probability for one or more bits using a trellis representation comprising one or more branches between one or more states in a first portion of the trellis and one or more states in a second portion of the trellis, with one or more of the states having forward and backward state probabilities, and with one or more of the branches having branch metrics, the system comprising:

first logic for grouping one or more of the branches into groups;

second logic for performing, for one or more of the groups, a group operation on one or more of the branch metrics for the branches in the group to determine a group value for the group;

third logic for updating, for one or more of the groups, the group value for the group based at least in part on one or more state probabilities; and fourth logic for deriving a first value from one or more of the updated group values for groups which imply release of a logical "1" for the bit, deriving a second value from one or more of the updated group values for groups which imply release of a logical "0" for the bit, and deriving an estimate of or extrinsic output for the bit from the first and second values.

14. The system of claim 13 wherein the third logic is configured to update, for one or more of the groups, the group value for the group based at least in part on the a priori probabilities for the one or more bits.

15. The system of claim 13 wherein the group operation is the MAX* operation.

16. The system of claim 15 wherein the MAX* of one or more of the updated group values for groups which imply release of a logical "1" for the bit forms the first value.

17. The system of claim 16 wherein the MAX* of one or more of the updated group values for groups which imply release of a logical "0" for the bit forms the second value.

18. The system of claim 17 wherein the second value is subtracted from the first value to form a soft estimate of or extrinsic output for the bit.

19. The system of claim 13 which is configured to iterate k times, wherein k is an integer of one or more, for each of k bits.

20. A system for determining an estimate of or extrinsic output for one or more bits using a trellis representation comprising one or more branches between one or more states in a first portion of the trellis and one or more states in a second portion of the trellis, with one or more of the states having forward and backward state probabilities, and with one or more of the branches having branch metrics, the system comprising:

first means for grouping one or more of the branches into groups;

second means for performing, for one or more of the groups, a group operation on one or more of the branch metrics for the branches in the group to determine a group value for the group;

third means for updating, for one or more of the groups, the group value for the group based at least in part on one or more state probabilities; and fourth means for deriving a first value from one or more of the updated group values for groups which imply release of a logical "1" for the bit, deriving a second value from one or more of the updated group values for groups which imply release of a logical "0" for the bit, and deriving the estimate of or extrinsic output for the bit from the first and second values.

21. The system of claim 20 wherein the third means is configured to update, for one or more of the groups, the group value for the group based at least in part on the a priori probabilities of the one or more bits.

22. A system for computing the MAX* of operands A and B comprising:

first logic for testing the difference A−B relative to zero, and outputting a signal indicative thereof, second logic for determining the maximum of the operands A and B, MAX(A,B), by outputting a signal representative of the operand A if the signal from the first logic indicates that the difference A−B is greater than zero, and outputting a signal representative of the operand B otherwise;

third logic for determining the absolute value of A–B by outputting a signal representative of the difference A–B if the signal from the first logic indicates that the difference A–B is greater than zero, and outputting a signal representative of the difference B–A otherwise;

fourth logic for retrieving a value corresponding to ln(1+exp(−|A−B|)) from a lookup table using as an argument a value derived from the absolute value of A–B; and fifth logic for determining a value corresponding to MAX (A, B)+ln(1+exp(−|A−B|)) from signals derived from the outputs of the second and fourth logic, and outputting a signal indicative thereof.

23. A system for performing a MAX* $2^p$->1 operation, where p is an integer of two or more, comprising:

a hierarchical arrangement of MAX* 2->1 logic modules having p levels, ranging from 1, the highest level, to p, the lowest level;

wherein a level q, $1 \leq q \leq p$, of the hierarchy comprises $2^{(p-q)}$ MAX* 2->1 logic modules configured in parallel.

24. A system for computing one or more forward state probabilities or for computing one or more backward state probabilities in a trellis representation comprising one or more branches between one or more states in a first portion of the trellis representation and one or more branches in a second portion of the trellis representation, the system comprising:

branch metric logic for computing one or more branch metrics for one or more of the branches;

indication logic for indicating whether the system is configured to compute forward state probabilities or backward state probabilities;

state probability logic for (1) computing one or more forward state probabilities for one or more states in the second portion of the trellis, provided the indication logic indicates the system is configured to compute forward state probabilities; or (2) computing one or more backward state probabilities of one or more states in the first portion of the trellis, provided the indication logic is configured to compute backward state probabilities.

25. The system of claim 24 further comprising estimation/extrinsic output logic for computing an estimate of or extrinsic output for one or more bits.

26. The system of claim 25 wherein the estimation/extrinsic output logic is activated only when the system is configured to compute forward state probabilities.

27. The system of claim 25 wherein the state probability logic is configured to recursively compute the state probabilities.

28. A system which may be configured for computing one or more forward state probabilities or for computing one or more backward state probabilities in trellis representation comprising one or more branches between one or more states in a first portion of the trellis and one or more states in a second portion of the trellis, the system comprising:

branch metric means for computing one or more branch metrics for one or more of the branches;

indication means for indicating whether the system is configured to compute forward or backward state probabilities;

state update means for (1) computing one or more forward state probabilities for one or more states in the second portion of the trellis, provided the system is configured to calculate forward state probabilities; or (2) computing one or more backward state probabilities for one or more states in the first portion of the trellis, provided the system is configured to calculate backward state probabilities.

29. The system of claim 28 further comprising estimation/extrinsic output means for computing an estimate of or extrinsic output for one or more bits.

30. The system of claim 28 wherein the state update means is configured to recursively compute state probabilities.

31. In decoding logic, a method of determining one or more state probabilities for one or more states in a trellis representation, the method comprising:

determining one or more branch metrics for one or more branches between one or more states in a first portion of the trellis and one or more states in a second portion of the trellis;

grouping one or more of the branches into groups;

performing, for one or more of the groups, a first group operation on one or more of the branch metrics for one or more of the branches in the group to determine a group value for the group;

updating, for one or more of the groups, the group value for the group based on one or more previously determined state probabilities; and performing, for one or more of the states, a second group operation on one or more of the updated group values to determine a state probability for the state.

32. The method of claim 31 wherein the first group operation is MAX*.

33. The method of claim 32 wherein the group value for a group is the MAX* of one or more of the branch metrics for branches in the group.

34. The method of claim 31 wherein the second group operation is MAX*.

35. The method of claim 34 wherein the updated group value for a group is the MAX* of one or more of the branch metrics for one or more of the branches in the group added to a forward state probability for the originating state for the group, or a backward state probability for the terminating state of the group.

36. The method of claim 35 wherein the state probability for a state is determined by performing the MAX* of one or more of the updated group values for groups either originating from or terminating at the state.

37. In decoding logic, a method for determining one or more state probabilities for one or more states in a trellis representation, the method comprising:

a step for determining one or more branch metrics for one or more branches between one or more states in a first portion of the trellis and one or more states in a second portion of the trellis;

a step for grouping one or more of the branches into groups;

a step for performing, for one or more of the groups, a first group operation on one or more of the branch metrics for branches in the group to determine a group value for the group;

a step for updating, for one or more of the groups, the group value for the group based on one or more previously determined state probabilities; and a step for performing, for one or more of the states, a second group operation on one or more of the updated group values to determine a state probability for the state.

38. In decoding logic, a method for determining one or more state probabilities for states in a trellis representation, the method comprising:
   determining one or more branch metrics for one or more branches between one or more states in a first portion of the trellis and one or more states in a second portion of the trellis; and
   determining in parallel state probabilities for each of p states, where p is an integer of two or more, by performing the following substeps in parallel for each of the p states:
      grouping one or more of the branches into groups;
      performing, for one or more of the groups, a first group operation on one or more of the branch metrics for branches in the group to determine a group value for the group;
      updating, for one or more of the groups, the group value for the group; and
      performing a second group operation on one or more of the updated group values to determine a state probability for the state.

39. The method of claim 38 further comprising normalizing one or more of the state probabilities for the p states.

40. The method of claim 39 wherein the normalizing step comprises determining the maximum one of the state probabilities of one or more of the p states, and subtracting this maximum from one or more of the p state probabilities.

41. In decoding logic, a method of determining one or more state probabilities for one or more states in a trellis representation, the method comprising:
   a step for determining one or more branch metrics for one or more branches between one or more states in a first portion of the trellis and one or more states in a second portion of the trellis; and
   a step for determining in parallel state probabilities for each of p states, where p is an integer of two or more, which comprises performing, for each of the p states, the following substeps in parallel:
      a substep for grouping one or more of the branches into groups;
      a substep for performing, for one or more of the groups, a first group operation on one or more of the branch metrics for branches in the group to determine a group value for the group;
      a substep for updating, for one or more of the groups, the group value for the group based on one or more previously determined state probabilities; and
      a substep for performing a second group operation on one or more of the updated group values to determine a state probability for the state.

42. The method of claim 41 further comprising a step for normalizing one or more of the state probabilities for the p states.

43. In decoding logic, a method for determining an estimate of or extrinsic output for one or more bits using a trellis representation comprising one or more branches between one or more states in a first portion of the trellis and one or more states in a second portion of the trellis, with one or more of the states having forward state probabilities and one or more of the states having backward state probabilities, and with one or more of the branches between the first and second portions of the trellis having branch metrics, the method comprising:
   grouping one or more of the branches into groups;
   performing, for one or more of the groups, a group operation on one or more of the branch metrics for branches in the group to determine a group value for the group;
   updating, for one or more of the groups, the group value for the group based at least in part on one or more state probabilities; and
   deriving a first value from one or more of the updated group values for groups which imply release of a logical "1" for the bit, deriving a second value from one or more of the updated group values for groups which imply release of a logical "0" for the bit, and deriving the estimate of or extrinsic output for the bit from the first and second values.

44. The method of claim 43 further comprising updating the one or more group values responsive to a priori probabilities of the one or more bits.

45. The method of claim 43 wherein the group operation is the MAX* operation.

46. The method of claim 43 wherein the MAX* of one or more of the updated group values for groups which imply release of a logical "1" for the bit forms the first value.

47. The method of claim 46 wherein the MAX* of one or more of the updated group values for groups which imply release of a logical "0" for the bit forms the second value.

48. The method of claim 47 wherein the second value is subtracted from the first value to form a soft estimate of or extrinsic output for the bit.

49. The method of claim 43 which iterates k times, wherein k is an integer of one or more, for each of k bits.

50. In decoding logic, a method for determining an estimate of or extrinsic output for one or more bits using a trellis representation comprising one or more branches between one or more states in a first portion of the trellis and one or more states in a second portion of the trellis, with one or more of the states forward state probabilities, and one or more of the states having backward state probabilities, and with one or more of the branches having branch metrics, the method comprising:
   a step for grouping one or more of the branches into groups;
   a step for performing, for one or more of the groups, a group operation on one or more of the branch metrics for branches in the group to determine a group value for the group;
   a step for updating, for one or more of the groups, the group value for the group based at least in part on one or more state probabilities; and
   a step for deriving a first value from one or more of the updated group values for groups which imply release of a logical "1" for the bit, deriving a second value from one or more of the updated group values for groups which imply release of a logical "0" for the bit, and deriving the estimate of or extrinsic output for the bit from the first and second values.

51. The method of claim 50 further wherein the step for updating further comprises updating the group value for the group based at least in part on a priori probabilities for one or more of the bits.

52. In decoding logic, a method for computing the MAX* of operands A and B comprising:
   testing the difference A−B relative to zero, and outputting a first signal indicative thereof;
   determining the maximum of the operands A and B by outputting a second signal representative of the operand A if the first signal indicates that the difference A−B is greater than zero, and outputting a second signal representative of the operand B otherwise;
   determining the absolute value of A−B by outputting a third signal representative of the difference A−B if the first signal indicates that the difference A–B is greater than zero, and outputting a third signal representative of the difference B–A otherwise;

retrieving a value corresponding to $\ln(1+\exp(-|A-B|))$ from a lookup table using as an argument a value derived from the value represented by the third signal, and outputting a forth signal representative thereof; and deriving a value corresponding to $MAX(A, B)+\ln(1+\exp(-|A-B|))$ from the values represented by the second and fourth signals, and outputting a fifth signal indicative thereof.

53. In decoding logic a method of performing a MAX* $2^P\text{->}1$ operation, where p is an integer of two or more, comprising:

performing a hierarchy of MAX* 2->1 operations having p levels, ranging from 1, the highest level, to p, the lowest level;

performing in parallel at a level q, $1 \leq q \leq p$, in the hierarchy $2^{(p-q)}$ MAX* 2->1 operations.

54. In decoding logic, a method for computing one or more forward state probabilities or one or more backward state probabilities in a trellis representation comprising one or more branches between one or more states in a first portion of the trellis representation and one or more states in a second portion of the trellis representation, the method comprising:

computing one or more branch metrics for one or more of the branches;

indicating whether forward or backward operation is desired;

if forward operation is desired, computing one or more forward state probabilities of one or more states in the second portion of the trellis; and if backward operation is desired, recursively computing one or more backward state probabilities of one or more states in the first portion of the trellis.

55. The method of claim 54 further comprising computing an estimate of or extrinsic output for one or more bits.

56. The method of claim 55 further comprising computing the estimate of or extrinsic output for a bit only when forward operation is desired.

57. The method of claim 55 further comprising recursively computing state probabilities.

58. In decoding logic, a method of computing one or more forward state probabilities or one or more backward state probabilities in a trellis representation comprising one or more branches between one or more states in a first portion of the trellis representation and one or more states in a second portion of the trellis representation, the method comprising:

a step for computing one or more branch metrics for one or more of the branches;

a step for indicating whether forward or backward operation is desired;

a step for computing one or more forward state probabilities of one or more states in the second portion of the trellis, provided forward operation is desired; and a step for computing one or more backward state probabilities of one or more states in the first portion of the, provided backward operation is desired.

59. The method of claim 58 further comprising a step for computing an estimate of or extrinsic output for one or more bits.

60. The method of claim 59 further comprising a step for computing an estimate of or extrinsic output for a bit only if forward operation is desired.

61. A system for determining a branch metric for a branch in a trellis, the branch associated with one or more symbols and one or more bits, comprising:

first logic for determining a first correlation value representing the level of correlation between one or more symbols and the one or more symbols associated with the branch;

second logic for determining a second correlation value representing the level of correlation between one or more bits and the one or more bits associated with the branch; and third logic for deriving the branch metric for the branch from the first and second correlation values.

62. A system for determining a branch metric for a branch in a trellis, the branch associated with one or more symbols and one or more bits, comprising:

first means for determining a first correlation value representing the level of correlation between one or more symbols and the one or more symbols associated with the branch;

second means for determining a second correlation value representing the level of correlation between one or more bits and the one or more bits associated with the branch; and third means for deriving the branch metric for the branch from the first and second correlation values.

63. In decoding logic, a method for determining a branch metric for a branch in a trellis, the branch associated with one or more symbols and one or more bits, comprising:

determining a first correlation value representing the level of correlation between one or more symbols and the one or more symbols associated with the branch;

determining a second correlation value representing the level of correlation between one or more bits and the one or more bits associated with the branch; and deriving the branch metric for the branch from the first and second correlation values.

64. In decoding logic, a method for determining a branch metric for a branch in a trellis, the branch associated with one or more symbols and one or more bits, comprising:

a step for determining a first correlation value representing the level of correlation between one or more symbols and the one or more symbols associated with the branch;

a step for determining a second correlation value representing the level of correlation between one or more bits and the one or more bits associated with the branch; and a step for deriving the branch metric for the branch from the first and second correlation values.

65. The methods of any of claims 31, 37, 38, 41, 43, 50, 52, 53, 54, 58, 63, or 64 tangibly embodied as a series of instructions stored on a processor readable medium.

66. A system comprising:

the processor readable medium of claim 65; and a processor configured to access the medium, and execute the instructions stored thereon, thereby performing the method embodied by the instructions.

* * * * *